United States Patent
Tanabe et al.

(10) Patent No.: US 8,310,316 B2
(45) Date of Patent: Nov. 13, 2012

(54) OSCILLATOR CIRCUIT

(75) Inventors: Akira Tanabe, Tokyo (JP); Naoya Inoue, Tokyo (JP)

(73) Assignee: NEC Corporation, Tokyo (JP)

(*) Notice: Subject to any disclaimer, the term of this patent is extended or adjusted under 35 U.S.C. 154(b) by 152 days.

(21) Appl. No.: 12/680,504

(22) PCT Filed: Sep. 9, 2008

(86) PCT No.: PCT/JP2008/066622
§ 371 (c)(1),
(2), (4) Date: Mar. 26, 2010

(87) PCT Pub. No.: WO2009/041304
PCT Pub. Date: Apr. 2, 2009

(65) Prior Publication Data
US 2010/0244972 A1    Sep. 30, 2010

(30) Foreign Application Priority Data
Sep. 28, 2007  (JP) ................................. 2007-256837

(51) Int. Cl.
H03B 5/12 (2006.01)
(52) U.S. Cl. .......... 331/117 R; 331/107 R; 331/116 FE; 331/167
(58) Field of Classification Search .............. 331/107 R, 331/116 FE, 117 R, 167
See application file for complete search history.

(56) References Cited

U.S. PATENT DOCUMENTS

| 6,816,020 B2 * | 11/2004 | Wood ............................. 331/57 |
| 7,046,113 B1 * | 5/2006 | Okamoto et al. ............. 336/200 |
| 2004/0140528 A1 * | 7/2004 | Kim et al. .................... 257/537 |
| 2007/0018767 A1 * | 1/2007 | Gabara ......................... 336/200 |
| 2008/0129434 A1 * | 6/2008 | Khajehpour ................. 336/139 |

FOREIGN PATENT DOCUMENTS

| JP | H01-256203 A | 10/1989 |
| JP | H05-062010 A | 8/1993 |
| JP | H05-291044 A | 11/1993 |
| JP | H06-061058 A | 3/1994 |
| JP | 2002-151953 A | 5/2002 |
| JP | 2004-140165 A | 5/2004 |
| JP | 2004-266718 A | 9/2004 |
| JP | 2005-341332 A | 12/2005 |
| JP | 2006-197571 A | 7/2006 |
| JP | 2006-245455 A | 9/2006 |

OTHER PUBLICATIONS

International Search Report for PCT/JP2008/066622, mailed Nov. 11, 2008.
B. Soltanian et al., "An Ultra Compact Differentially Tuned 6 GHz CMOS LC VCO with Dynamic Common-Mode Feedback", IEEE 2006 Custom Intergrated Circuits Conference (CICC), pp. 671-674.

* cited by examiner

Primary Examiner — Joseph Chang
Assistant Examiner — Jeffrey Shin

(57) ABSTRACT

A first wiring layer and a plurality of second wiring layers having a thickness smaller than the first wiring layer are stacked on the semiconductor substrate. An oscillator circuit has an inductor formed by the plurality of second wiring layers. The inductor oscillates at a frequency at which the inductor and a parasitic capacitance of an inverter circuit resonate. A drain of an n-type MISFET and a drain of a p-type MISFET of the inverter circuit are connected to each other, and an output of the inductor is connected to a connection point of those drains.

13 Claims, 15 Drawing Sheets

OSCILLATOR CIRCUIT

TECHNICAL FIELD

The present invention relates to an oscillator circuit having a transistor for analog use and a passive element, and more particularly to an on-chip oscillator circuit mounted on a semiconductor substrate.

BACKGROUND ART

In recent years, digital circuits have been developed to increase their speed. Chips operable at a high speed of at least 1 GHz have been in general use. With such high clock frequencies, the stability of clock signals is essential to the stability of the chip operation. It is difficult to transmit a high-speed clock of at least 1 GHz between chips. Therefore, there has generally been used a method of generating such a high-speed clock by a clock generator circuit provided on a chip. For this purpose, an oscillator circuit with stable operation should be mounted on a chip.

For oscillation of low frequencies, a ring oscillator has been used as an oscillator circuit formed on a chip. However, an oscillation frequency of a ring oscillator is determined by delay time of an inverter having a semiconductor circuit. Therefore, a ring oscillator is susceptible to temperature, voltage, noise, production variations, and the like, resulting in unstable operation.

LCVCO (LC Voltage-Controlled Oscillator) circuits, which employ resonance of an inductor (L) and a capacitor (C), are suitable to provide an oscillator circuit with higher accuracy than a ring oscillator. In order to implement an on-chip LCVCO circuit, an inductor and a capacitor need to be mounted on a chip. However, an inductance value of about a few nH is required to produce an oscillation frequency of about 1 GHz. Inductors with such an inductance value have a size of a few hundred μm square. Therefore, an inductor occupies a large area on a chip.

FIG. 1 is a block diagram of a general LCVCO circuit. In FIG. 1, the LCVCO circuit is formed by an inverter circuit and an oscillator circuit including an inductor and a capacitor. An oscillation frequency fo of this circuit is simply given by the following formula (1):

$$fo \approx \frac{1}{2\pi\sqrt{LC}} \quad (1)$$

where L is an inductance value of the inductor, and C is a capacitance value of the capacitor.

A minimum requirement for this circuit to oscillate is that a gain along a loop shown by the arrow in FIG. 1 exceeds 1 at the oscillation frequency. However, a parasitic resistance or a parasitic capacitance of the inductor wiring cannot be ignored in the on-chip inductor. The parasitic capacitance can be regarded as part of the capacitance of the capacitor because of parallel connection to the capacitor connected in parallel to the inductor. However, because the series resistance decreases the gain, it is necessary to sufficiently reduce the series resistance.

FIGS. 2 and 3 show examples of an LCVCO circuit that implements the block diagram of FIG. 1. FIG. 2 shows an nMOS (negative channel Metal Oxide Semiconductor) circuit, and FIG. 3 shows a CMOS (Complementary MOS) circuit.

Referring to FIG. 2, an inverter circuit of the nMOS circuit is formed only by n-type MISFETs (Metal-Insulator-Semiconductor Field-Effect Transistors). Inductors are connected between each of drain terminals OUT3 and OUT4 of the two n-type MISFETs and a power source VDD. At the time of oscillation, voltages of OUT3 and OUT4 vary around a voltage of (the series resistance of VDD-inductors)×Ic/2 where Ic is a current flowing through the current source. In a general LCVCO, a series resistance of an inductor is as small as a few Ω. Therefore, the center voltage is almost the same as VDD.

Referring to FIG. 3, an inverter circuit of the CMOS circuit is formed by n-type MISFETs and p-type MISFETs. An inductor is connected between connection points OUT3 and OUT4 of drain terminals of the n-type MISFETs and the p-type MISFETs. Voltages of OUT1 and OUT2 are determined by balance of driving forces between the n-type MISFETs and the p-type MISFETs. Generally, the voltages of OUT1 and OUT2 are about a half of VDD.

FIG. 4 is a conceptual plan view of an LCVCO as an oscillator circuit using a conventional on-chip inductor. In FIG. 4, the inductor wiring uses the uppermost layer of wiring layers in a multilayer wiring structure. Furthermore, the capacitor uses a parasitic capacitance of the wiring or a gate capacitance of the MISFET in a case of a fixed capacitance and uses a gate capacitance of the MISFET or a junction capacitance of p+ and n+ of a silicon substrate in a case of a variable capacitance. In a multilayer metal wiring structure on a general silicon substrate, the film thickness of a wire in an upper layer is larger than that of a wire in a lower layer. Therefore, the uppermost layer wire, which has the largest film thickness, is used in order to reduce a series resistance of the wiring. Moreover, a wiring layer underneath the uppermost layer, which has a thickness smaller than the largest film thickness, may be used along with the uppermost layer wiring in order to reduce the series resistance. In this case, the wiring of the lower layer is not solely used and is connected in parallel or in series to the wiring of the uppermost layer. Furthermore, in a case of a wiring structure having a plurality of wiring layers with the largest film thickness, wires are connected in parallel or in series to the wiring of the uppermost layer. Additionally, in order to achieve a low series resistance, the total length of wiring is set to be about 1 mm, and the wire width is widened to be about 10 μm. In this case, for a general on-chip inductor having an inductance of about 1 nH, the series resistance is equal to or lower than 5Ω. However, an on-chip inductor uses a large chip area because wide wires are arranged over the total length of about 1 mm Furthermore, an MISFET used for an inverter circuit to operate this inductor has a large gate width in order to increase the gain. Generally, an MISFET having a gate width of about 100 μm is used.

Japanese laid-open patent publication No. 2005-341332 discloses an oscillator circuit having inverters, inductors, and capacitors for switching at a resonance frequency of the inductors and the capacitors. Furthermore, Japanese laid-open patent publication No. 06-061058 discloses an on-chip inductor device that is constructed three-dimensionally with a plurality of wiring layers. Additionally, *Custom Integrated Circuit Conference*, 2006, p. 671-674 discloses that a conventional LCVCO uses an inductance of about 1 nH to obtain an oscillation frequency of about 6 GHz.

Conventional on-chip inductors for an LCVCO, including the example shown in FIG. 4, require a large chip area in order to reduce a series resistance and maintain a sufficient inductance value. Accordingly, the area of the LCVCO also increases. Hence, the area of the chip semiconductor device also increases.

DISCLOSURE OF INVENTION

It is, therefore, an object of the present invention to provide an oscillator circuit with a small required area.

According to the present invention, there is provided an on-chip oscillator circuit mounted on a semiconductor substrate, wherein a first wiring layer and a plurality of second wiring layers having a thickness smaller than the first wiring layer are stacked on the semiconductor substrate, the oscillator circuit comprises: an inductor formed by the plurality of second wiring layers, and an inverter circuit including an n-type MISFET and a p-type MISFET, the inductor is connected to the inverter circuit so as to operate as a load on the inverter circuit, the inductor is operable to oscillate at a frequency at which the inductor and a parasitic capacitance of the inverter circuit resonate, a drain of the n-type MISFET and a drain of the p-type MISFET are connected to each other, and an output of the inductor is connected to a connection point of those drains.

The oscillator circuit may further comprise a capacitor formed by using a semiconductor device or the first wiring layer or the second wiring layers. The inductor and the capacitor may be connected in series or in parallel to each other. The inductor may oscillate at a frequency at which the inductor, the parasitic capacitance of the inverter circuit, and the capacitor resonate. An output of the capacitor may be connected to the connection point at which the drains of the n-type MISFET and the p-type MISFET are connected to each other.

The oscillator circuit may further comprise an additional inductor magnetically coupled to the inductor. Opposite ends of a switching element or a resistance element having a variable resistance may be connected between an input end and an output end of the additional inductor. The oscillation frequency of the oscillator circuit may be varied by varying a resistance value of the switching element or the resistance element.

The oscillator circuit may further comprise a capacitor formed by using a semiconductor device or the first wiring layer or the second wiring layers and an additional inductor magnetically coupled to the inductor. The capacitor may have a fixed capacitance. The inductor and the capacitor may be connected in series or in parallel to each other. The inductor may oscillate at a frequency at which the inductor, the parasitic capacitance of the inverter circuit, and the capacitor resonate. An output of the capacitor may be connected to the connection point at which the drains of the n-type MISFET and the p-type MISFET are connected to each other. Opposite ends of a switching element or a resistance element having a variable resistance may be connected between an input end and an output end of the additional inductor. The oscillation frequency of the oscillator circuit may be varied by varying a resistance value of the switching element or the resistance element.

The plurality of second wiring layers forming the inductor may include a first layer to an nth layer stacked on each other where n is an integer not less than 2. Each of the first layer to the nth layer may extend substantially concentrically with respect to a common center from the outermost track as a first track to the innermost track as an nth track where m is an integer not less than 2 and may have a discontinuous end in each track. Wiring layers of the plurality of second wiring layers that are located vertically adjacent to each other may be connected to each other through a via at a location at which each of the wiring layers has the discontinuous end such that currents flow in the same direction through the wiring layers. Tracks located radially adjacent to each other in a wiring layer of the uppermost layer or the lowermost layer of the plurality of second wiring layers may be connected to each other at a location at which each of the tracks has the discontinuous end such that currents flow in the same direction through the tracks. The inductor may be connected continuously from an end of the first track of the first layer that is not connected to another track to an end of the mth track of the first layer or the nth layer that is not connected to another track. Currents may flow in the same direction through tracks stacked vertically adjacent to each other. Currents may flow in the same direction through tracks arranged adjacent to each other in each of the plurality of second wiring layers.

Furthermore, the plurality of second wiring layers forming the inductor may include a first layer to an nth layer stacked on each other where n is an integer not less than 2. Each of the first layer to the nth layer may extend substantially concentrically with respect to a common center from the outermost track as a first track to the innermost track as an mth track where m is an integer not less than 2 and may have a discontinuous end in each track. The first layer to the nth layer may have a substantially congruous shape as viewed in a plan view and may be arranged without substantial deviation in a direction of rotation with respect to the common center. An end of the (k−1)th track of the (j−1)th layer may be connected to an end of the (k−1)th track of the jth layer through a via where j is an integer ranging from 2 to n and k is an integer ranging from 2 to m. Another end of the (k−1)th track of the jth layer may be connected to an end of the (k−1)th track of the +1)th layer in a case where j is smaller than n. An end of the kth track of the first layer that is opposite to an end connected to the second layer may be connected to an end of the (k−1)th track of the first layer in a case where k is equal to m and may be connected to an end of the (k+1)th track of the first layer in a case where k is smaller than m. An end of the kth track of the nth layer that is not connected to the (n−1)th layer may be connected to an end of the (k−1)th track of the nth layer in a case where k is equal to m and may be connected to an end of the (k+1)th track of the nth layer in a case where k is smaller than m. The inductor may be connected continuously from an end of the first track of the first layer that is not connected to another track to an end of the mth track of the first layer or the nth layer that is not connected to another track. Currents may flow in the same direction through tracks stacked vertically adjacent to each other. Currents may flow in the same direction through tracks arranged adjacent to each other in the same layer.

Moreover, the plurality of second wiring layers forming the inductor may have a capacitance per length between wires stacked vertically adjacent to each other that is larger than a capacitance per length between wires arranged adjacent to each other in the same layer.

Furthermore, the plurality of second wiring layers forming the inductor may have an interval between wires arranged adjacent to each other in the same layer that is larger than an interval between wires stacked vertically adjacent to each other.

Moreover, the inductor may have a wire width that is larger than a thickness of the second wiring layers, which is a wire thickness of the inductor.

Furthermore, a value of at least $10^{11}$ may be obtained when an inductance value of the inductor is divided by a capacitance of the capacitor and multiplied by the oscillation frequency.

Moreover, the inductor may have a wire width that is equal to or less than 2 µm.

Furthermore, the MISFET included in the inverter circuit may have a gate width that is equal to or less than 20 µm.

The oscillator circuit may be configured to oscillate at a frequency that is n times as high as a required frequency where n is an integer and to perform 1/n frequency division on the oscillated output to thereby output the required frequency.

BEST MODE FOR CARRYING OUT THE INVENTION

Figure 5:
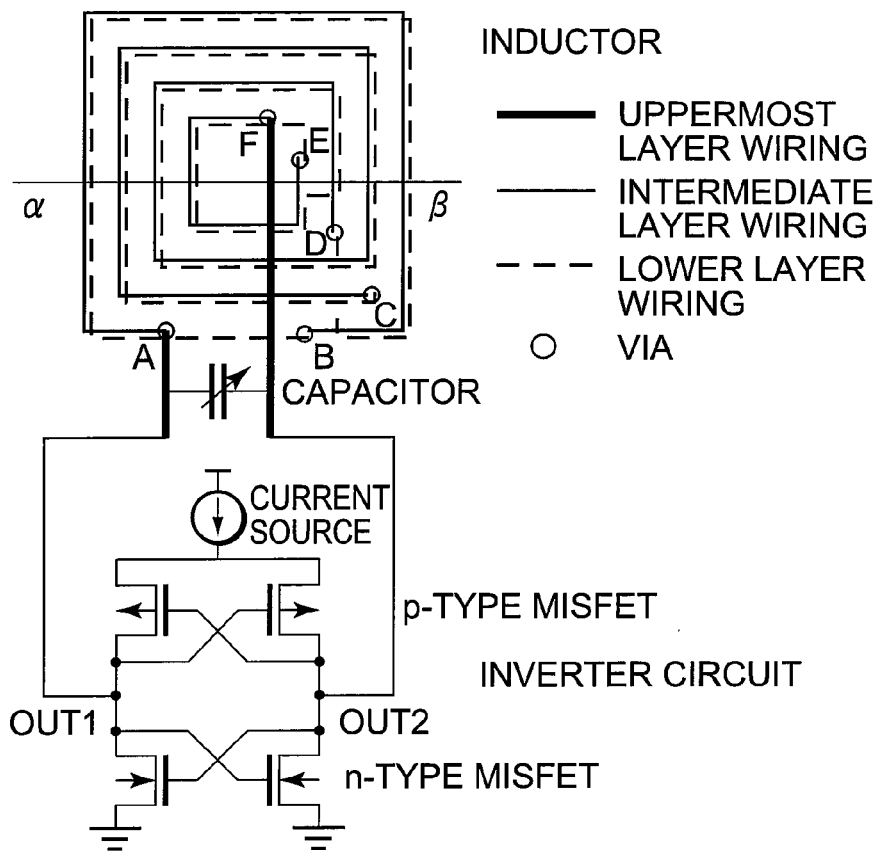
FIG. 5 is a conceptual plan view of an oscillator circuit according to an embodiment of the present invention, particularly according to Example 2 of the present invention.

Referring to FIG. 5, an LCVCO according to the present invention includes an inverter circuit using two inverters, an inductor, and a capacitor. As shown in FIG. 5, the inductor wiring is located underneath wires of the uppermost layer (first wiring layer). The inductor wiring is formed by a plurality of wiring layers having a film thickness smaller than that of the uppermost layer (a plurality of second wiring layers). Furthermore, the capacitor uses a fixed or variable capacitance element. The capacitor uses a parasitic capacitance of the wiring or a gate capacitance of MISFETs in the case of a fixed capacitance and uses a gate capacitance of MISFETs or a junction capacitance of p+ and n+ of a silicon substrate in the case of a variable capacitance.

Figure 6:
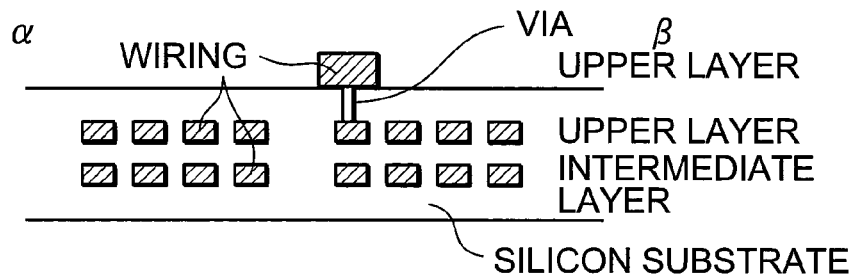
FIG. 6 is a cross-sectional view taken along cutting-plane line α-β of an inductor in the oscillator circuit shown in FIG. 5.

FIG. 6 is a cross-sectional view taken along cutting-plane line α-β of the inductor in FIG. 5. As can be seen from FIG. 6, the inductor wiring uses wiring layers located underneath the uppermost layer that have a film thickness smaller than that of the uppermost layer. A wire having a minimum line width smaller than that of the uppermost layer wire can be used in a lower wiring layer. Therefore, the line width of the inductor can be reduced. As a result, the area of the inductor can be reduced. Furthermore, the inductor wiring uses a plurality of wiring layers. The wiring layers of the inductor are connected in series to each other. Accordingly, the area of the inductor can be reduced as compared to a case where only one layer is used for the inductor.

In FIG. 5, the inductor wiring moves to an upper or lower wiring layer through a via each time it makes one round. A signal inputted from point A into the inductor makes one round through an intermediate layer wire and moves to a lower layer wire at point B. Then the signal makes one round through the lower layer wire, moves to an inner track, makes one round through the inner track, and moves to the intermediate layer wire at point C. The signal makes one round through the intermediate layer wire, moves to an inner track, makes one round through the inner track, and moves to the lower layer wire at point D. The signal makes one round through the lower layer wire, moves to an inner track, makes one round through the inner track, and moves to the intermediate layer wire at point E. The signal makes one round through the intermediate layer wire. Then the signal is outputted from the inductor at point F.

Figure 7:
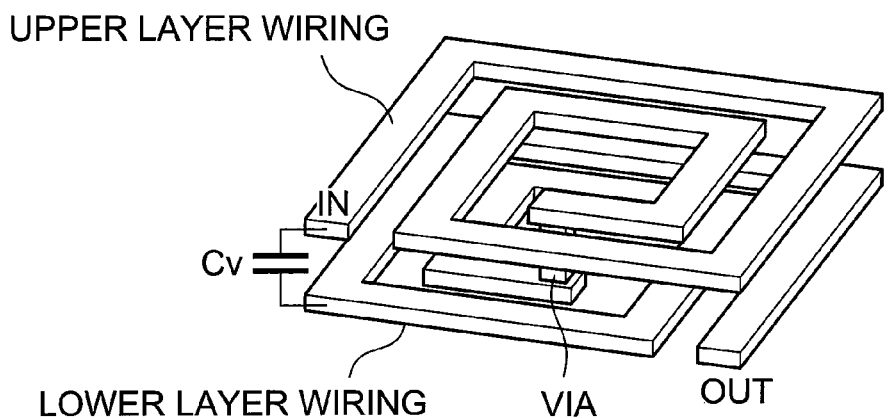
FIG. 7 is a perspective view of a spiral-stacking type inductor.
Figure 8:
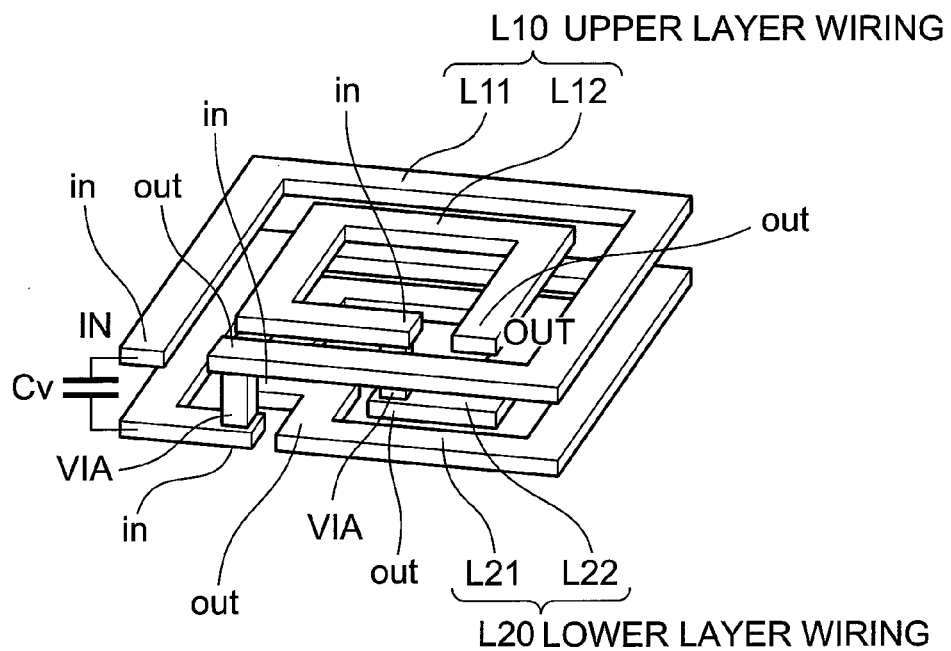
FIG. 8 is a perspective view of a 3D solenoid type inductor.

Next, there will be described how to wind the inductor wiring. FIGS. 7 and 8 show inductors having different winding arrangements. Both inductors include metal wiring with two layers. The wiring makes two rounds in each layer. The inductor of FIG. 7 is arranged such that two flat spiral inductors are stacked. (This type of inductor is hereinafter referred to as a spiral-stacking type inductor.) In the inductor of FIG. 8, the wiring has a discontinuous end formed in each track and moves to an upper or lower wire through a via. (This type of inductor is hereinafter referred to as a 3D (three-dimensional) solenoid type inductor.)

A specific example of the 3D solenoid structure will be described with reference to FIG. 8. A plurality of second wiring layers forming an inductor in an oscillator circuit according to the present invention includes a first layer to an nth layer stacked on each other where n is an integer not less than 2, i.e., a first layer L10 as an upper layer and a second layer L20 as a lower layer, which are vertically stacked adjacent to each other.
(Specifically, n=2 in this example.)

The first layer L10 extends substantially concentrically with respect to a common center, including a first track of the outermost track to an mth track of the innermost track where m is an integer not less than 2. The first layer L10 has a discontinuous end in each track. That is, the first track L11 of the outermost track and the second track L12 of the innermost track of the first layer L10 extend substantially concentrically with respect to a common center. (Specifically, m=2 in this example.) The first layer L10 has a discontinuous end in each track. The second layer L20 extends substantially concentrically with respect to a common center, including a first track L21 of the outermost track and a second track L22 of the innermost track. The second layer L20 has a discontinuous end in each track.

Furthermore, the first layer L10 and the second layer L20 have a substantially congruous shape as viewed in the plan view. The first layer L10 and the second layer L20 are arranged without substantial deviation in a direction of rotation with respect to the common center.

An output end (out) of the first track L11 of the first layer L10 and an input end (in) of the first track L21 of the second layer L20 are connected to each other by a via.

Furthermore, an output end (out) of the first track L21 of the second layer L20 and an input end (in) of the second track L22 of the second layer L20 are connected to each other within the second layer L20.

Moreover, an output end (out) of the second track L22 of the second layer L20 and an input end (in) of the second track L12 of the first layer L10 are connected to each other by another via.

With such a 3D solenoid structure, the wiring is connected continuously from the input end (in) (IN) of the first track L11 of the first layer L10 to the output end (out) (OUT) of the second track L12 of the first layer L10. Furthermore, currents flow in the same direction through the tracks vertically stacked adjacent to each other. Additionally, currents flow in the same direction through the tracks arranged adjacent to each other in the same layer. The structure shown in FIG. 5 is also a sort of the 3D solenoid structure.

Here, a parasitic capacitance of both of the winding structures shown in FIGS. 7 and 8 will be described.

Figure 9:
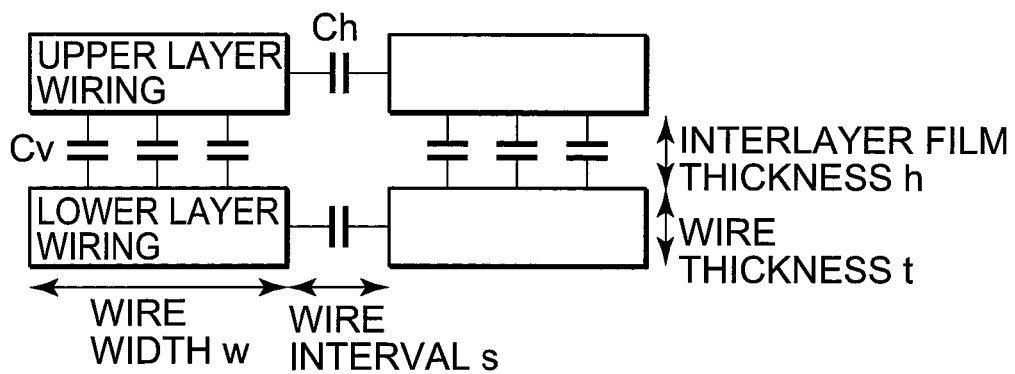
FIG. 9 is a cross-sectional view of wiring of the inductor shown in FIG. 7 or 8, particularly inductor wiring of an oscillator circuit according to Example 5 of the present invention.

FIG. 9 is a schematic view of a cross-section of the wiring. Wide wires are generally used for inductor wiring in order to reduce the series resistance of the wiring. Therefore, the wire width w is larger than the wire thickness t. If insulators of the wiring layers have the same dielectric constant in the overall wiring layers, then a capacitance Cv between the upper wire and the lower wire is larger than a capacitance Ch between the right wire and the left wire. Specifically, a dominant component to a parasitic capacitance of inductor wiring of an inductor having a general multilayer structure is a capacitance Cv between an upper wire and a lower wire. Additionally, capacitances other than the capacitance Cv between an upper wire and a lower wire can further be reduced by increasing an interval s between wires laterally arranged so as to be larger than an interlayer film thickness h of the wires.

Figure 10:
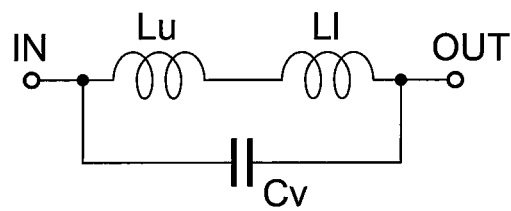
FIG. 10 is an equivalent circuit diagram showing a parasitic capacitance of the inductor of FIG. 7.
Figure 11:
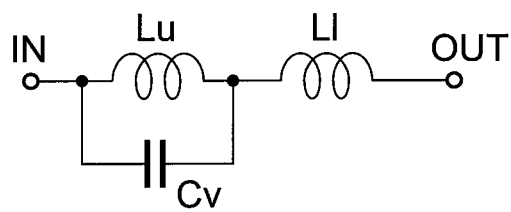
FIG. 11 is an equivalent circuit diagram showing a parasitic capacitance of the inductor of FIG. 8.

This capacitance Cv is illustrated in FIGS. 7 and 8. FIGS. 10 and 11 show equivalent circuits of the inductor including the capacitance Cv between the upper wire and the lower wire. FIG. 10 shows an equivalent circuit of FIG. 7, and FIG. 11 shows an equivalent circuit of FIG. 8. In FIG. 10, the capacitance Cv between the upper wire and the lower wire is connected directly to the input point IN and the output point OUT. Therefore, the capacitance Cv is directly observed from the exterior of the inductor. In contrast, the capacitance Cv between the upper wire and the lower wire is connected to the middle of the inductor wiring in FIG. 11. Therefore, Cv is not directly observed from the exterior of the inductor. Accordingly, influence of Cv is reduced. Specifically, an effective parasitic capacitance as viewed from opposite ends of the inductor is lower in FIG. 11, i.e., in the 3D solenoid structure of FIG. 8. In the structure of FIG. 5, the parasitic capacitance between the points A and B is also reduced.

Figure 2:
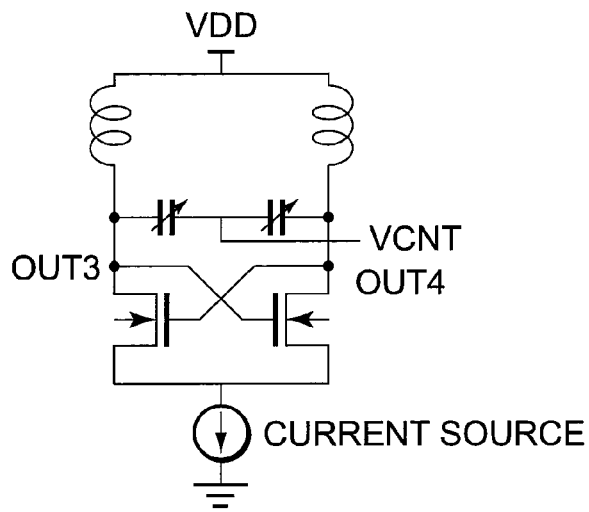
FIG. 2 is a circuit diagram of a general nMOS oscillator circuit.

In FIG. 5, the inverter circuit of the LCVCO is a CMOS circuit using n-type MISFETs and p-type MISFETs. As described above, in an nMOS circuit, the center voltages of the point OUT3 and the point OUT4 in FIG. 2, i.e., the operation points are lower than VDD by a half of the product of the series resistance of the inductor and the current of the current source. In the inductor according to the present invention, the series resistance is higher than that of an inductor of a conventional LCVCO. When the center voltages are lowered by a voltage drop due to the series resistance, a voltage between a source and a drain of an MISFET is reduced, so that a gain of the MISFET is lowered. Since the present invention employs a CMOS inverter, the center voltages are not influenced by the series resistance of the inductor.

Figure 12:
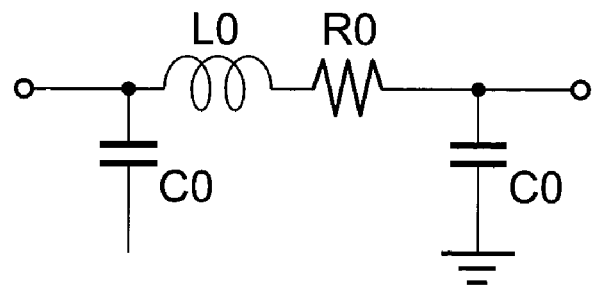
FIG. 12 is an equivalent circuit diagram of the inductor in the oscillator circuit shown in FIG. 5.
Figure 13:
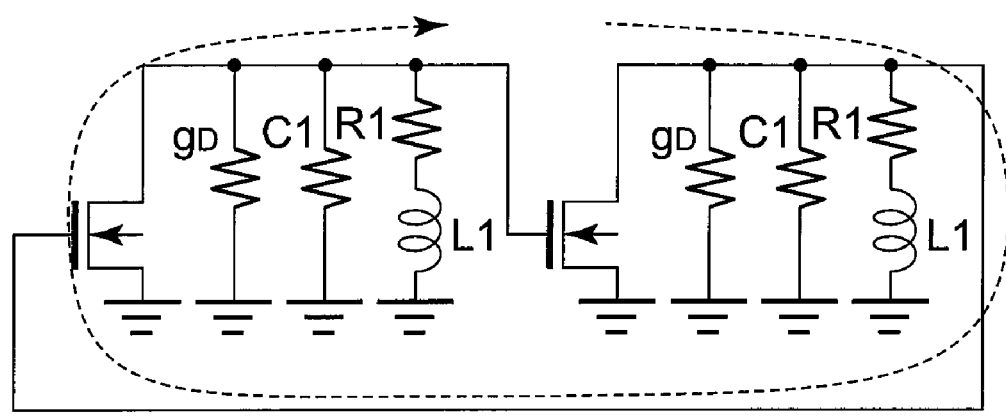
FIG. 13 is an equivalent circuit diagram of the oscillator circuit shown in FIG. 5.

There will be described the relationship between the series resistance and the inductance of the inductor. An equivalent circuit of the inductor shown in FIG. 5 can be illustrated as in FIG. 12. In FIG. 12, it is assumed that the inductor has a series connection of an inductance L0 and a resistance R0 and also has a parasitic capacitance of C0 with respect to the ground, i.e., the substrate. Furthermore, it is assumed that the capacitor of FIG. 5 has a capacitance Cv and that a series resistance is negligible. Using FIG. 12, a small signal equivalent circuit of FIG. 5 can be illustrated as in FIG. 13. Here, only the n-type MISFETs are considered for the inverter circuit, and the p-type MISFETs are ignored. It is assumed that the capacitor has a capacitance C0 and that a series resistance is negligible. The assumption holds for an inductor and a capacitor of a general LCVCO circuit. The relationships that L1=L0/2 R1=R0/2, and C1=2Cv+C0 are established between the circuit constant of FIG. 13 and the values of the inductor and the capacitor of FIG. 5. In FIG. 13, $g_D$ is an output conductance of the MOSFETs.

The gain of this circuit is Gm×Z where Z is a series impedance of the resonance circuit, and Gm is a transconductance of the transistors. Here, Z is given by the following formula (2).

$$Z = \frac{1}{\frac{1}{R1 + j\omega L1} + j\omega C1 + g_D} \qquad (2)$$

Furthermore, an oscillation frequency $f_0$ is a frequency at which the imaginary part of Z is zero and is thus given by the following formula (3).

$$f_0 = \frac{\omega}{2\pi} = \frac{1}{2\pi}\sqrt{\frac{L1 - R1^2 C1}{L1^2 C1}} \tag{3}$$

The formula (3) becomes equal to the formula (1) when $R1 \to 0$.

Accordingly, the gain is given by the following formula (4).

$$\text{gain} = Gm \times Z = Gm \times \left(\frac{R1^2 + \omega^2 L1^2}{R1 + R1^2 g_D + \omega^2 g_D L1^2}\right) \tag{4}$$

The requirement for the circuit of FIG. 13 to oscillate is that the gain of the formula (4) exceeds 1 at the oscillation frequency. Specifically, a larger gain is preferable at the oscillation frequency. According to the present invention, the series resistance R1 of the inductor wiring is larger than that of conventional inductor wiring because the wiring has a small film thickness and a small wire width. Therefore, if inductor wiring having the same inductance value is used, then the gain is reduced so as to be smaller than that of a conventional LCVCO. Thus, the circuit becomes unlikely to oscillate. However, it can be seen that larger L and smaller C are preferable in order to increase the grain to be larger than that of the formula (4). Specifically, with regard to combinations of L and C required to obtain the same oscillation frequency, the gain becomes larger with larger L and smaller C. In other words, it can be seen that the circuit can oscillate if L is made larger and C is made smaller as compared to a conventional LCVCO.

The inductance value of the inductor, the series resistance value, and the parasitic capacitance value are simply proportional to the wire length. Therefore, L and R simultaneously increase when the wire length is increased. However, the parasitic capacitance value of the inductor also increases, so that a desired oscillation frequency cannot be obtained. Furthermore, if the wire length of the inductor is increased, an area required for the inductor is increased, which is impractical. In the formula (4), Gm and gD are both proportional to the gate width Wg of the MOSFET. Therefore, if Gm is increased in order to increase the gain, the gate width of the transistor is increased so as to increase a required area.

For example, in a case of a flat inductor, the inductance value L of a square inductor is experimentally given by the following formula (5):

$$L l1 = 1.3 \times 10^{-7} \times \frac{(w \times l)^{5/3}}{A_{tot}^{1/6} w^{1.75} (w + \text{gap})^{0.25}} \tag{5}$$

Atot: the total area of the inductor including the wires, gaps between the wires, and the central area of the inductor
w: the width of the inductor wiring
l: the total length of the inductor wiring
gap: the width of the gaps between the wires of the inductor In the formula (5), the third term in parenthesis can be ignored for the wire length of an inductor used for an LCVCO. It can be seen from the formula (5) that the inductance value increases when the width w of the wiring is reduced.

Furthermore, the series resistance R of the wiring is given by the following formula (6):

$$R = \frac{\rho \times l}{w \times t} \tag{6}$$

where p is a resistivity of the wiring, and n is the number of multiple wiring layers that form the inductor.

While the present invention uses a plurality of wiring layers, the wires of those layers are arranged close to each other in the vertical direction. Therefore, a large magnetic coupling is produced between upper and lower wires, thereby increasing the inductance value. For example, assuming that the coupling coefficient between upper and lower wires is 1, the inductance value is given by the following formula (7):

$$L = Ll1 \times n^2 \tag{7}$$

where n is the number of the wiring layers used for the inductor, and Ll1 is an inductance in a case where one layer is used for the inductor.

Figure 14:
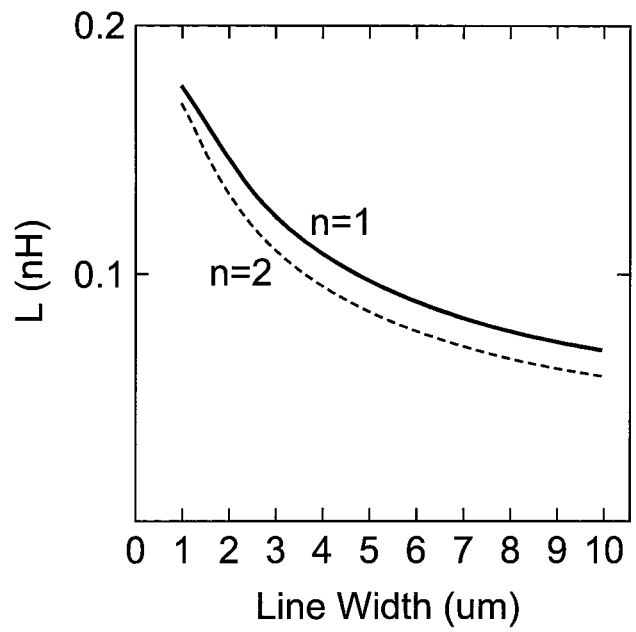
FIG. 14 is a graph showing the relationship between the wire width of the inductor and the inductance.
Figure 15:
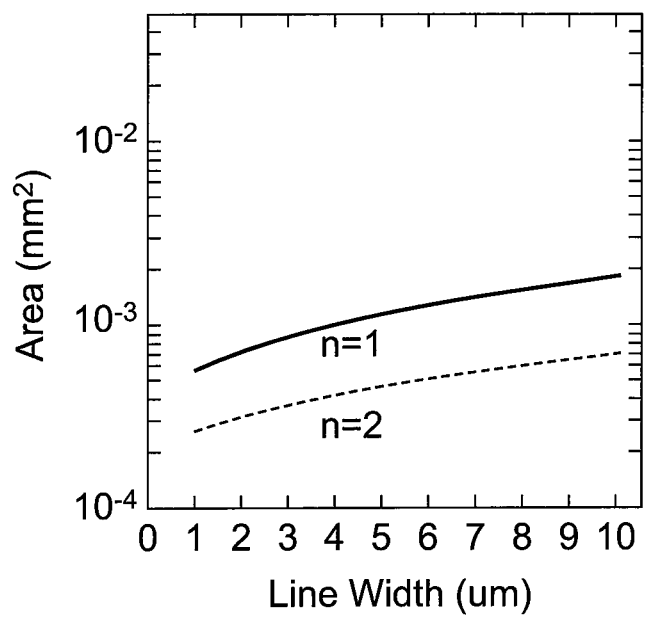
FIG. 15 is a graph showing the relationship between the wire width of the inductor and the area of the inductor.

For example, it is assumed that the metal wiring has a film thickness of 0.3 µm and a sheet resistance of $30^{-7}$ S/um, that the width of the gaps between the wires is 2 µm, that the gate width of the MISFET is 100 µm, and that Gm and $g_D$ per 1 µm of the gate width are 0.001 S/um2 and 0.0001 S/um2, respectively. Those assumed values are general values in a MOSFET having a gate length of about 0.1 µm. By using the formulas (5), (6), and (7), an inductance value required to obtain a gain of 1 at an oscillation frequency of 1 GHz is calculated as shown in FIG. 14. Furthermore, an area required for this inductance is calculated as shown in FIG. 15. Here, the area A is defined as an area of the wiring only and calculated by the following formula (8).

$$A = l \times w / n \tag{8}$$

In FIGS. 14 and 15, the horizontal axes represent the wire width w, and the vertical axes represent the inductance and the area, respectively. Solid lines represent a case where the inductor is formed by a conventional structure of one wiring layer (n=1), and dotted lines represent a case where the inductor is formed by two wiring layers according to the present invention (n=2). It can be seen that a smaller area is required to obtain the same oscillation frequency when the inductance is increased by reducing the wire width. Furthermore, it can be seen that the area is smaller in the case where the number of layers in the inductor is larger.

According to the present invention, the wire width of the inductor wiring can be reduced by using a wire of a lower layer, which has a small wire width. Therefore, the area can be reduced. The parasitic capacitance of the wiring can be reduced by reducing the wire width. Nevertheless, the parasitic capacitance of the inductor wiring does not increase significantly. Furthermore, use of a plurality of wiring layers allows an area of the inductor to be reduced as compared to the case of one-layer wiring.

Figure 16:
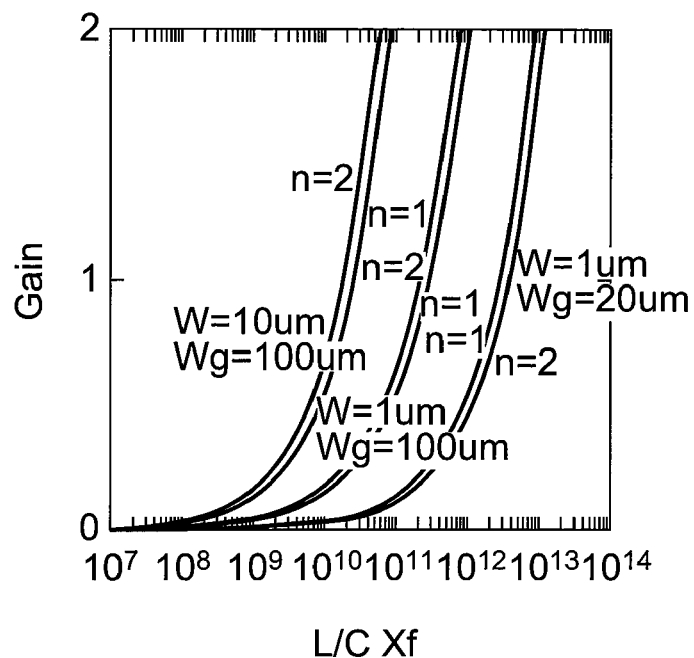
FIG. 16 is a graph showing the relationship between the wire width of the inductor and the inductance/capacitance× frequency.

FIG. 16 shows the gain plotted in cases where the inductance value was varied for wire widths of 1 µm and 10 µm by varying the wire length. Since the inductor of the conventional LCVCO uses the uppermost layer wiring, the horizontal axis of FIG. 16 corresponds to the inductance value L divided by the capacitance value C and multiplied by the oscillation frequency, i.e., L/C×f. Here, as with FIGS. 10 and 11, the metal wiring had a film thickness of 0.3 µm and a sheet resistance of $30^{-7}$ Ωcm, and Gm and $g_D$ per 1 µm of the gate width were 0.001 S/um and 0.0001 S/µm, respectively. Furthermore, the oscillation frequency was 1 GHz. As shown in FIG. 16, if the wire width is constant, then the gain does not depend upon the value of n and is approximately determined by L/C×f. From FIG. 16, if the wire width is reduced, L/C×f for the gain to exceed 1 increases irrespective of the number of wiring layers.

In the conventional LCVCO, the line width cannot be reduced because of manufacturing limitations. Generally, the wire width has been about 10 μm. Therefore, the value of L/C×f has been about $10^{10}$. In contrast, according to the present invention, wires having a wire width of about 1 μm to about 2 μm are used, so that the value increases by one order of magnitude and becomes about $10^{11}$. Furthermore, according to the present invention, the gate width of the MISFET can be reduced (for example, the gate width is equal to or less than 20 μm) while the area of the inductor is reduced. Therefore, advantages of reduction of the area can be enhanced. In this case, L/C×f is further increased to about $10^{13}$.

As disclosed by *Custom Integrated Circuit Conference,* 2006, p. 671-674, which has been mentioned in Background Art, a conventional LCVCO uses an actual circuit having an inductance of about 1 nH in order to obtain an oscillation frequency of about 6 GHz. According to the present invention, a value of about 10 nH is used. At that time, the capacitance value is about 0.5 pF in the conventional structure. In contrast, according to the present invention, the capacitance value is about 0.05 pF. Therefore, while the inductance/capacitance×frequency is about $1.2×10^{11}$ in the conventional structure, it becomes as large as about $1.2×10^{13}$ according to the present invention.

According to the formula (1), the oscillation frequency is determined by the product of L1 and C1. Since C1=2Cv+C0, the amount of changes of the oscillation frequency with varied Cv becomes small if C0 is excessively large. However, since the parasitic capacitance of the inductor wiring is small in the present invention, this problem can be avoided.

Figure 17:
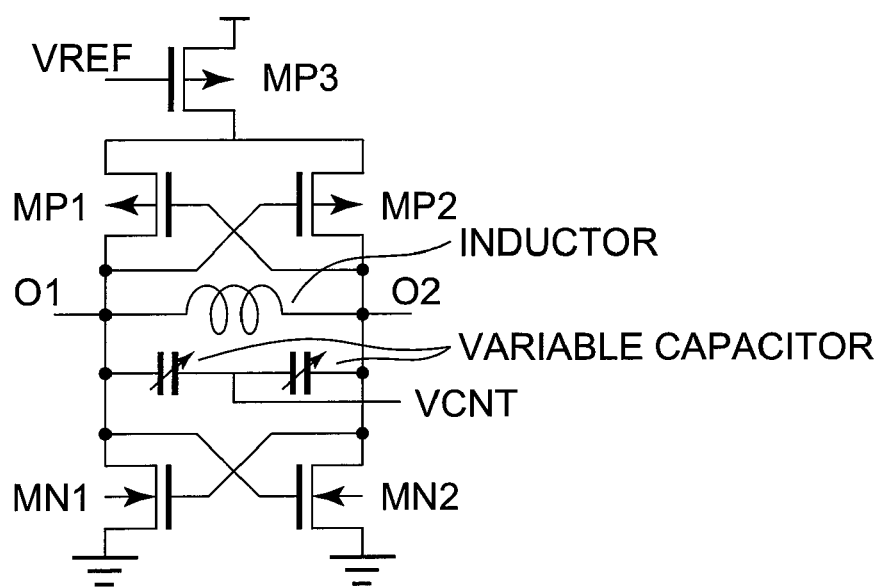
FIG. 17 is a circuit diagram of an oscillator circuit used for operation simulation.

FIG. 17 shows a circuit example of an LCVCO used for simulation. The circuit includes an inductor, variable capacitors, and MISFETs. The inverter includes n-type MISFETs MN1 and MN2 and p-type MISFETs MP1 and MP2. The inverter further includes a p-type MISFET MP3 used as a current source. The oscillation frequency is variable by changes of a series capacitance of the variable capacitors. The capacitance and the frequency are varied by a control voltage VCNT. Results of simulating this circuit with a circuit simulator SPICE will be described. It is assumed that the circuit is operated at 1 V with a 90-nm-node CMOS process.

Figure 18:
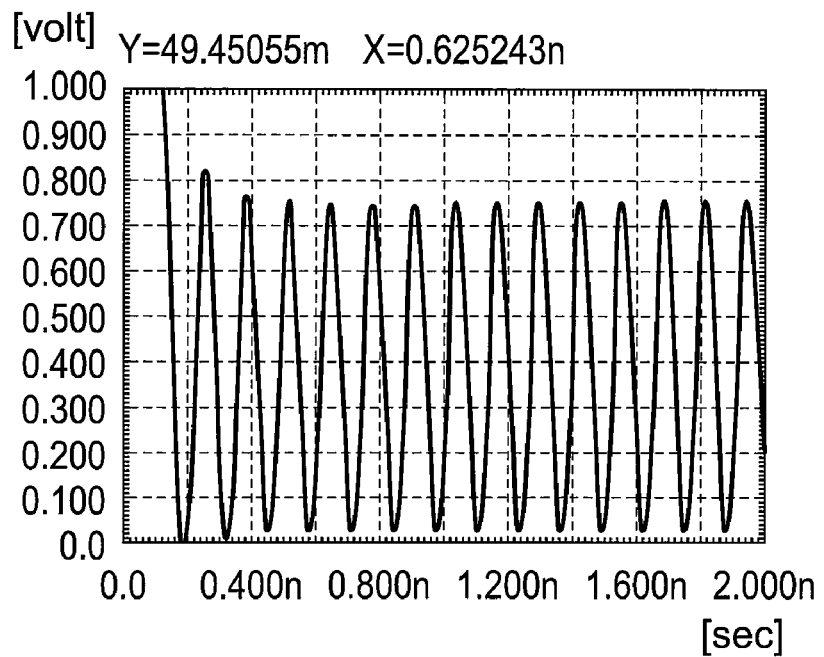
FIG. 18 is a graph showing a simulation waveform of operation of a conventional oscillator circuit as a comparative example.

FIG. 18 shows the simulation results of an oscillation waveform of an LCVCO circuit as a comparative example when an inductor element has an inductance of 0.55 nH and uses the uppermost layer wiring of a conventional structure. The inverter and the MISFET for the current source in this circuit have a large gate width of 100 μm to 1000 μm. In FIG. 18, the horizontal axis represents elapsed time, and the vertical axis represents the voltage of the output terminal O1. The series resistance of this inductor is about 1.9Ω. As shown in FIG. 18, the voltage of the output terminal O1 oscillates with time. Thus, oscillation occurs around 5 GHz.

Figure 1:
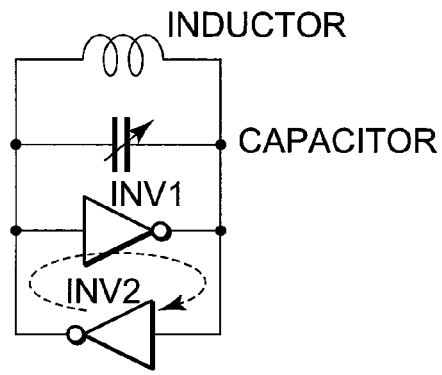
FIG. 1 is a block diagram of a general LCVCO oscillator circuit.
Figure 19:
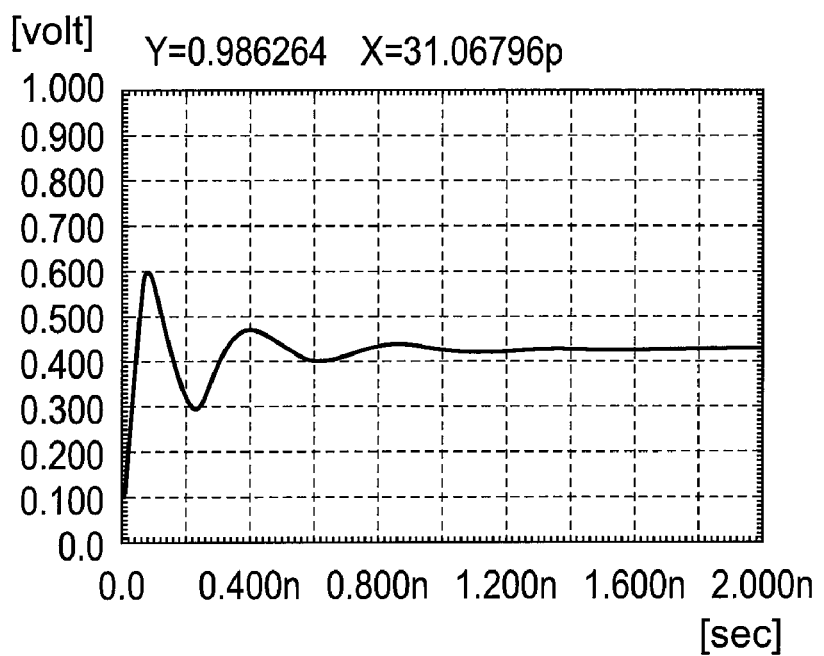
FIG. 19 is a graph showing a simulation waveform of operation of a conventional oscillator circuit as a comparative example using an inductor having a high resistance.

FIG. 19 shows a simulation waveform in a case where an inductor has an inductance of 0.55 nH and uses wiring layers located underneath the uppermost layer (the present invention). The series resistance of this inductor is about 27Ω. As shown in FIG. 19, the amplitude is gradually attenuated, and then the oscillation stops. This is because the gain of the loop shown by the dashed line in FIG. 1 is made equal to or less than 1 by the series resistance of the inductor.

Figure 20:
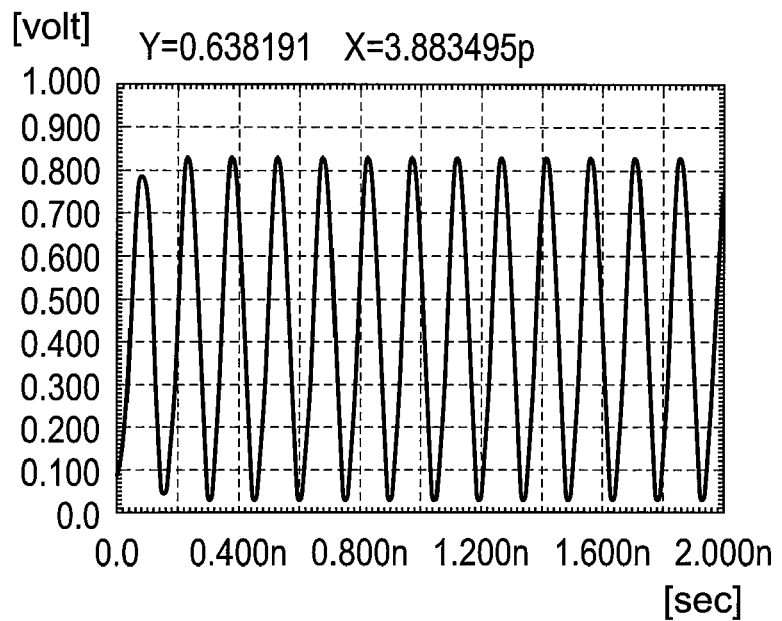
FIG. 20 is a graph showing a simulation waveform of operation of an oscillator circuit according to the present invention.

Meanwhile, FIG. 20 shows the simulation results in a case where an inductor is formed by wiring layers located underneath the uppermost layer, particularly when the inductance value is 10 nH (the present invention), which is about 20 times the inductance of the above example. While the inductance value of the inductor is about 20 times the inductance of the above example, the gate width of the inverter and the MISFET for the current source is reduced to 1/10 to 1/20 of the above example. Furthermore, the series resistance of the inductor is about 185Ω. This circuit continues to oscillate as shown in FIG. 20. This is because a large gain can be obtained by increasing the inductance value according to the formula (4).

Next, phase noise of an LCVCO will be described. The tendency of phase noise of an LCVCO varies according to an offset frequency. The phase noise at an offset frequency of about 1 MHz is analytically given by the following formula (9).

$$L(\Delta\omega) = 10\log\left(\frac{2kT}{Psig}\times\left(\frac{f0}{2Q\Delta f}\right)^2\right) \ldots (dBc/\text{Hz}) \quad (9)$$

Q: Q value of the LC resonator
Psig: power of signals of the LC resonator
f0: center frequency
Δf offset frequency Furthermore, the Q value of the inductor is given from the equivalent circuit of FIG. 13 through simple approximation by the following formula (10).

$$Q = \omega L0/R0 \quad (10)$$

Figure 21:
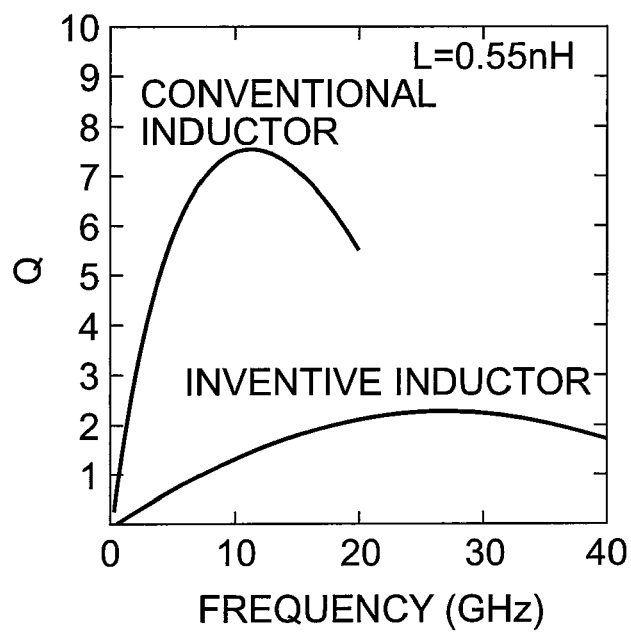
FIG. 21 shows a comparison of Q values of inductors.

Specifically, if the inductor has the same inductance value, the Q value decreases as the series resistance increases. FIG. 21 shows comparison of the Q values of the inductors used for the simulation of FIGS. 18 and 19. As shown in FIG. 21, the Q value of the inductor according to the present invention is smaller than that of the inductor of the conventional LCVCO having the same inductance value because the inductor according to the present invention has a higher series resistance. However, the self resonant frequency, at which the Q value becomes zero, is higher in the inductor according to the present invention. This is because the parasitic capacitance of the wiring can be reduced by reduction of the wire width as described above. Accordingly, the inductor according to present invention can oscillate at a frequency higher than a conventional inductor.

Figure 22:
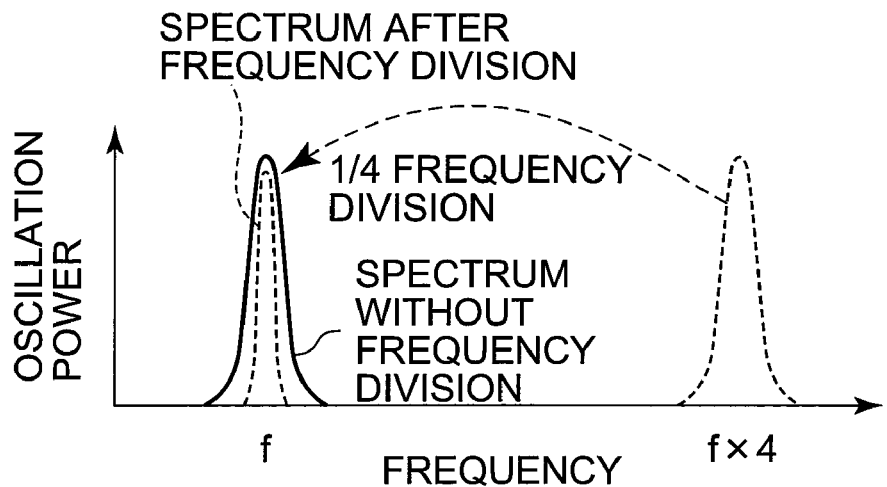
FIG. 22 is a diagram showing changes of a spectrum due to frequency division of an oscillation frequency.
Figure 23:
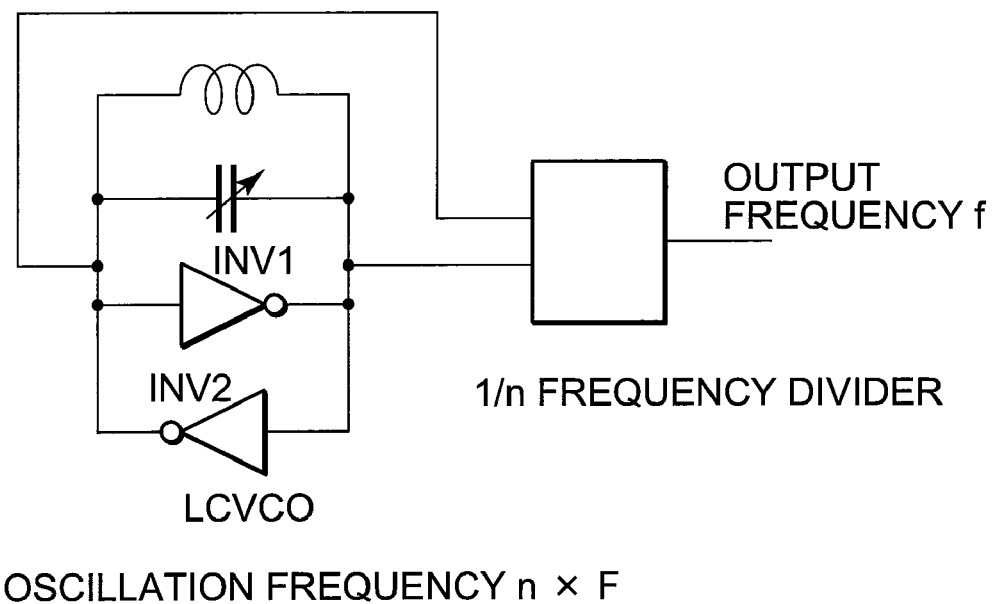
FIG. 23 is a block diagram of a circuit for performing frequency division of an oscillation frequency, specifically a circuit for performing frequency division of an oscillation frequency in an oscillator circuit according to Example 6 of the present invention.

When the inductor having a small Q value according to the present invention is used, phase noise increases according to the formula (9). However, it can be seen from the formula (9) that phase noise is reduced as an offset frequency Δf is larger. Specifically, after oscillation at a frequency that is n times as high as a required frequency, 1/n frequency division is performed on the output. As a result, phase noise can be reduced as shown in FIG. 22. FIG. 22 shows oscillation spectra in a case of oscillation at a quadruple frequency and subsequent ¼ frequency division and in a case of oscillation at a onefold frequency. As shown in FIG. 22, the frequency division reduces the half width of the spectrum, thereby improving phase noise. According to the formula (9), oscillation at an n-fold frequency and subsequent 1/n frequency division can reduce phase noise by 20× log(n) dB. FIG. 23 is a block diagram of a circuit to achieve the above reduction of phase noise. An oscillation frequency n×f of an oscillator is inputted into a 1/n frequency divider, which outputs a frequency f. In order to implement this scheme, the LCVCO needs to oscillate at a frequency higher than required. However, the inductor used for the LCVCO according to the present invention has a high self resonant frequency and can thus achieve an oscillation frequency higher than a conventional inductor.

Figure 24:
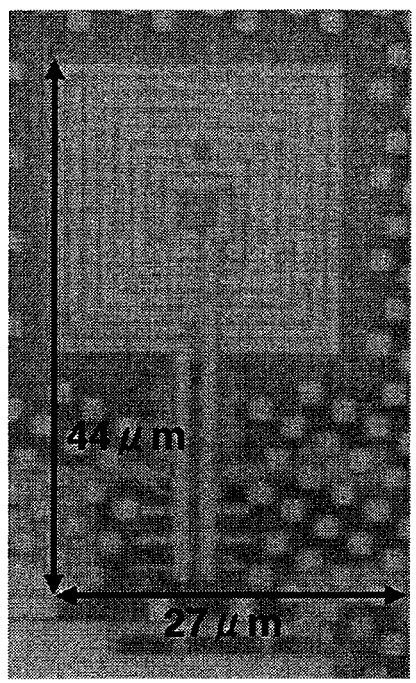
FIG. 24 is a view showing a photograph of a chip of an oscillator circuit according to the present invention.
Figure 25:
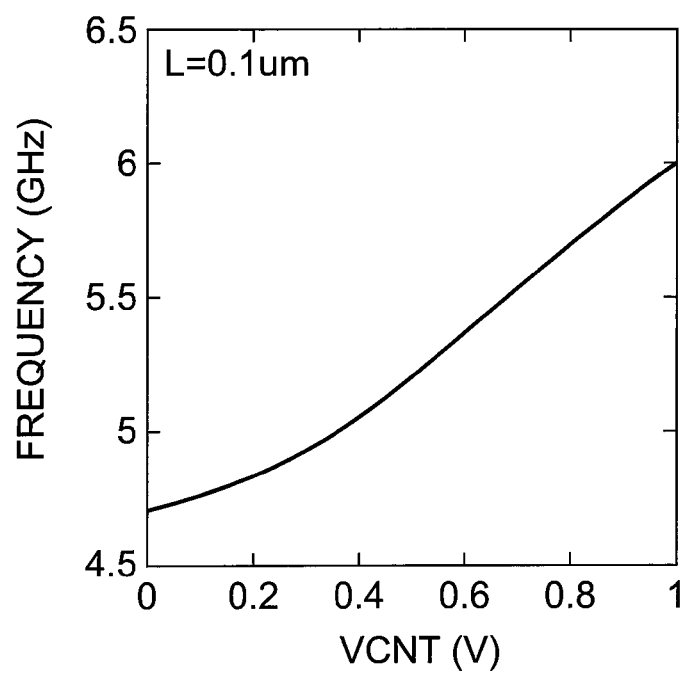
FIG. 25 is a diagram showing dependency of an oscillation frequency of an oscillator circuit according to the present invention on a control voltage.

Next, the results of trial production of an LCVCO circuit will be described. An LCVCO circuit having 6 layers of Cu wiring was produced as a trial by a 90-nm-node CMOS process. In this process, only the uppermost layer M6 included a thick wire having a film thickness of 0.9 and other layers included thin wires having a thickness of 0.3 μm or less. The inductor was formed by using thin wires M2 to M5 of four layers of the six layers. The inductor of about 10 nH as used in the simulation of FIG. 20 was used. FIG. 24 is a view showing a photograph of this chip. The size of the circuit was 44 μm×27 μm. Thus, the area of the circuit is equal to or smaller than 1/20 of the area of a conventional LCVCO, which uses a thick wire of the uppermost layer. FIG. 25 shows the dependency of the oscillation frequency on the control voltage VCNT. The power source voltage was 1.2 V. As shown in FIG. 25, a regular oscillation was obtained while the wiring resistance of the inductor was high. Variation of the oscillation frequency from 4.7 GHz to 6.0 GHz could be obtained by varying VCNT in a range of from 0 V to 1 V.

Figure 26:
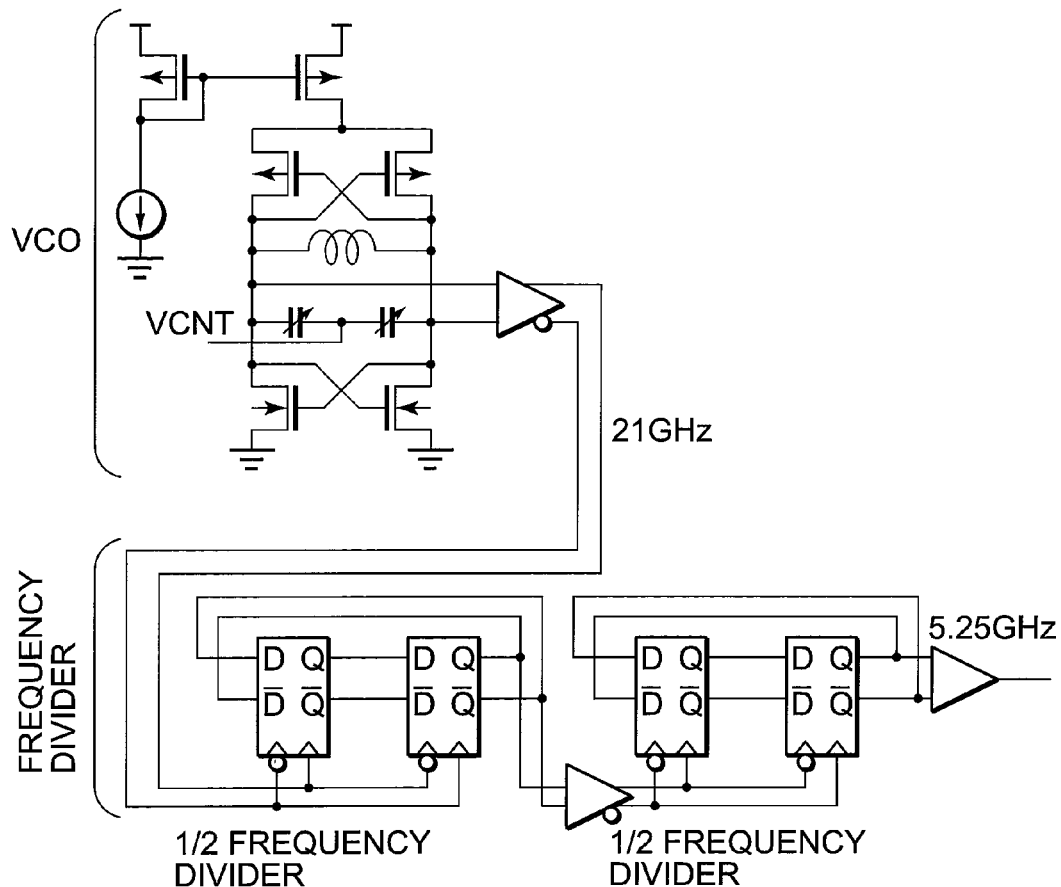
FIG. 26 is a circuit diagram of a circuit for performing frequency division of an oscillation frequency.
Figure 27:
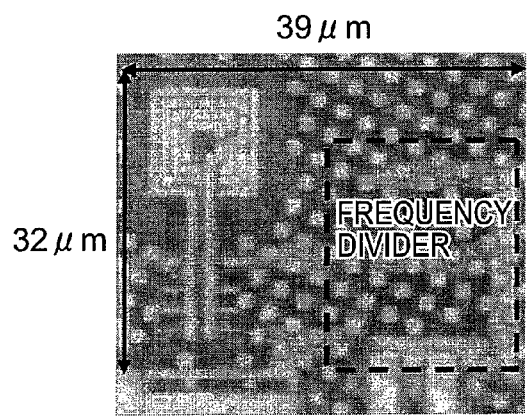
FIG. 27 is a view showing a photograph of a chip of an oscillator circuit according to the present invention for performing frequency division of an oscillation frequency.

FIG. 26 is a circuit diagram for implementing the block diagram of FIG. 23. VCO oscillates at about 21 GHz. The inductor used for this circuit has an inductance of about 2 nH. Using two ½ static frequency dividers, which include a D-type flip-flop, frequency division into about 5.25 GHz is performed on the output. With this configuration, phase noise can be improved. FIG. 27 is a view showing a photograph of a chip in which the circuit of FIG. 26 was produced as a trial. The used process was the same as that of FIG. 24. Similarly, the inductor used four layers M2 to M5. Although the area of the inductor was reduced by reduction of the inductance, the size of the circuit was 32 μm×39 μm because of addition of the area of the frequency dividers. Thus, the size of the circuit was substantially the same as that of FIG. 24.

Figure 28:
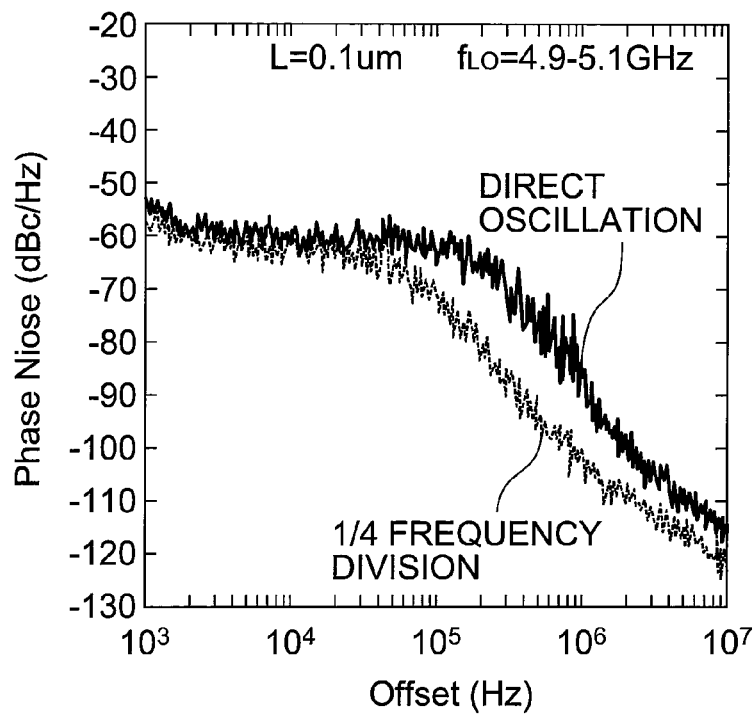
FIG. 28 is a graph showing phase noise of an oscillator circuit according to the present invention.

FIG. 28 shows the dependency of phase noise on the offset frequency in a case where a signal of about 5 GHz was directly oscillated by the chip of FIG. 24 and in a case where a signal of about 5 GHz was subjected to ¼ frequency division as in FIG. 27. Comparison of phase noise at an offset frequency near 1 MHz reveals that the ¼ frequency divider circuit reduced noise by about 10 dB. Thus, effects of the frequency division were exhibited.

Examples of the present invention will be described below.

EXAMPLE 1

Figure 29:
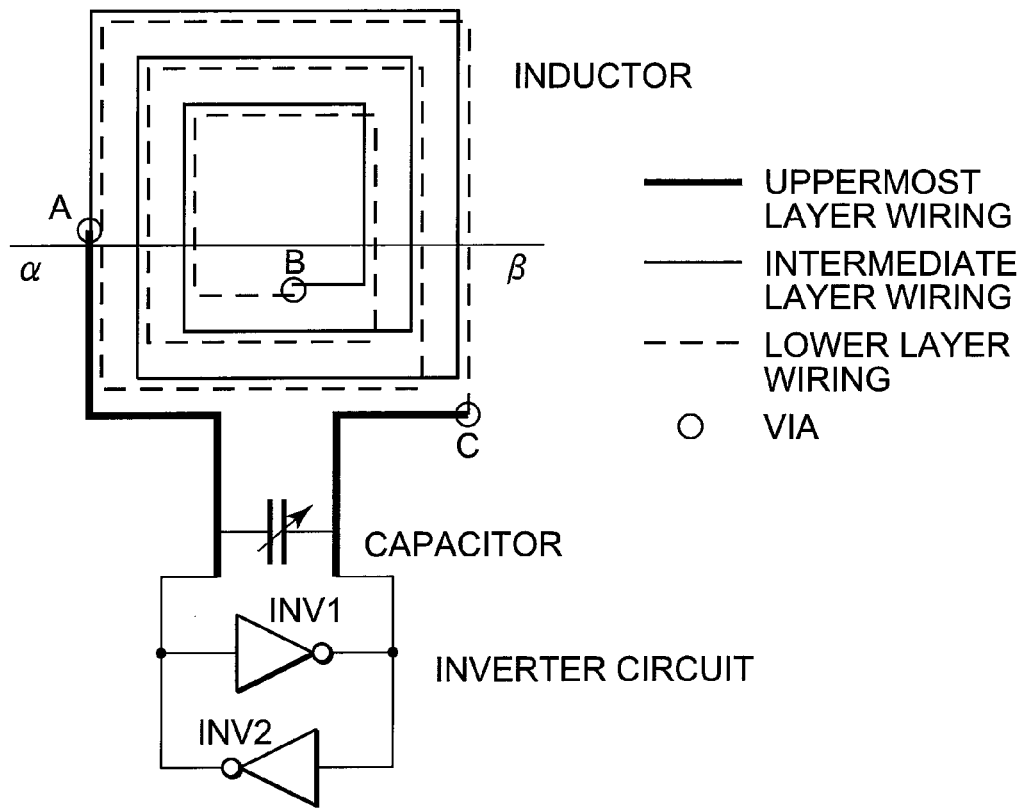
FIG. 29 is a conceptual plan view of an oscillator circuit according to Example 1 of the present invention.
Figure 30:
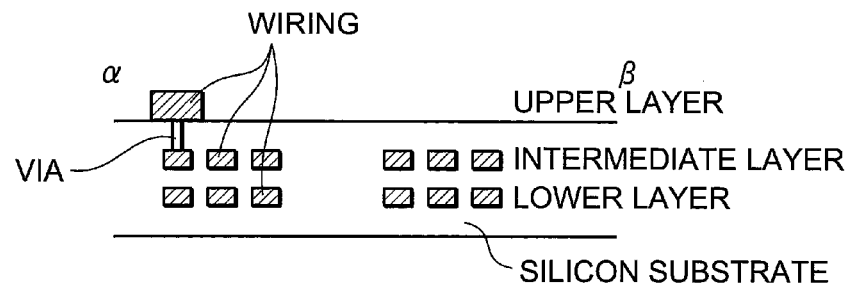
FIG. 30 is a cross-sectional view taken along cutting-plane line α-β of an inductor in the oscillator circuit shown in FIG. 29.

FIG. 29 is a conceptual plan view of an LCVCO as an oscillator circuit according to Example 1 of the present invention. FIG. 30 is a cross-sectional view taken along cutting-plane line α-β of the inductor of FIG. 29. In FIG. 29, the LCVCO includes an inverter circuit using two inverters INV1 and INV2, an inductor, and a capacitor having variable capacitance (varactor).

Here, as shown in the figures, the inductor wiring is formed by a plurality of wiring layers located underneath the uppermost layer wiring. The inductor wiring makes a plurality of rounds in each of the wiring layers and then moves to another wiring layer. Thus, the area of the inductor can be reduced. In FIG. 29, a signal inputted from point A into the inductor makes three rounds through the intermediate layer wire, moves to the lower layer wire at point B, and makes three rounds through the lower layer wire. Then, the signal is outputted from the inductor at point C. The point A and the point C are connected to output points OUT1 and OUT2 of the inverter circuit located adjacent to the inductor. The inverter circuit is a CMOS circuit using both of n-type MISFETs and p-type MISFETs.

EXAMPLE 2

FIG. 5 is a conceptual plan view of an LCVCO as an oscillator circuit according to Example 2 of the present invention. FIG. 6 is a cross-sectional view taken along cutting-plane line α-β of the inductor of FIG. 5. In FIG. 5, the LCVCO includes an inverter circuit using two inverters INV1 and INV2, an inductor, and a capacitor having variable capacitance (varactor).

As shown in the figures, the inductor wiring is formed by a plurality of wiring layers located underneath the uppermost layer wiring. The inductor wiring moves to an upper or lower wiring layer through a via each time it makes one round. A signal inputted from point A into the inductor makes one round through the intermediate layer wire and moves to the lower layer wire at point B. Then the signal makes one round through the lower layer wire, moves to an inner track, makes one round through the inner track, and moves to the intermediate layer wire at point C. The signal makes one round through the intermediate layer wire, moves to an inner track, makes one round through the inner track, and moves to the lower layer wire at point D. The signal makes one round through the lower layer wire, moves to an inner track, makes one round through the inner track, and moves to the intermediate layer wire at point E. The signal makes one round through the intermediate layer wire. Then the signal is outputted from the inductor at point F. With such a wiring structure, the wiring capacitance can be reduced as compared to a structure in which a signal makes a plurality of rounds in each wiring layer and then moves to another wiring layer. The inverter circuit of the LCVCO is a CMOS circuit using both of n-type MISFETs and p-type MISFETs.

EXAMPLE 3

Figure 31:
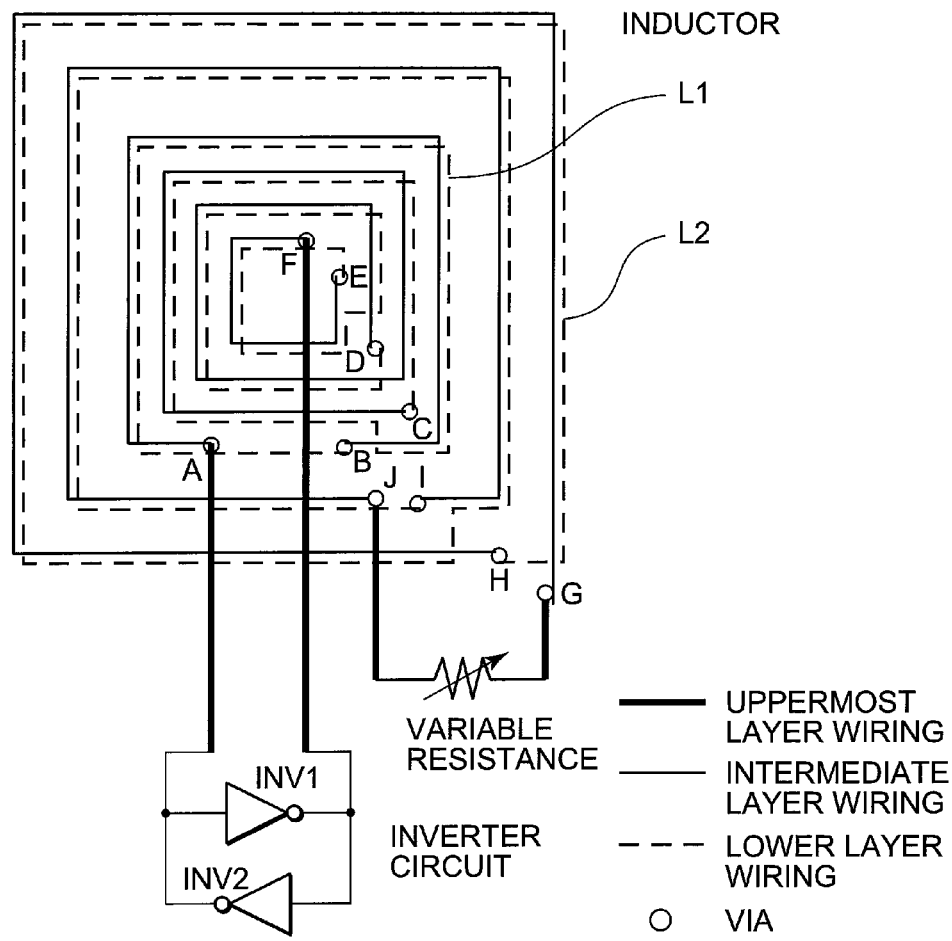
FIG. 31 is a conceptual plan view of an LCVCO as an oscillator circuit according to Example 3 of the present invention.

FIG. 31 is a conceptual plan view of an LCVCO as an oscillator circuit according to Example 3 of the present invention. In FIG. 31, the LCVCO includes an inverter circuit using two inverters INV1 and INV2, two inductors, i.e., an inductor L1 and an additional inductor L2, and a variable resistance connected across input and output ends G and J of the additional inductor L2. The inductor L1 forms an oscillator together with the inverter circuit. For example, the variable resistance uses a resistance between a source and a drain of a MISFET. Each of the inductors L1 and L2 is formed by a plurality of wiring layers (a plurality of second wiring layers) located underneath the uppermost layer wiring.

In FIG. 31, a signal inputted from point A into the inductor L1 makes one round through the intermediate layer wire and moves to the lower layer wire at point B. Then the signal makes one round through the lower layer wire, moves to an inner track, makes one round through the inner track, and moves to the intermediate layer wire at point C. The signal makes one round through the intermediate layer wire, moves to an inner track, makes one round through the inner track, and moves to the lower layer wire at point D. The signal makes one round through the lower layer wire, moves to an inner track, makes one round through the inner track, and moves to the intermediate layer wire at point E. The signal makes one round through the intermediate layer wire. Then the signal is outputted from the inductor L1 at point F.

Meanwhile, a signal inputted from point G into the additional inductor L2 makes one round through the intermediate layer wire and moves to the lower layer wire at point H. Then the signal makes one round through the lower layer wire, moves to an inner track, makes one round through the inner track, and moves to the intermediate layer wire at point I. The signal makes one round through the intermediate layer wire. Then the signal is outputted from the inductor L2 at point J.

At that time, an inductance and the series resistance across the inductor L1 are given by the following formula (11) and formula (12):

$$\text{Inductance: } L1 - \left( \frac{\omega^2 k^2 L1 L2}{\omega^2 L2^2 + (R2 + Rv)^2} \right) L2 \quad (11)$$

$$\text{Resistance: } R1 + \left( \frac{\omega^2 k^2 L1 L2}{\omega^2 L2^2 + (R2 + Rv)^2} \right)(R2 + Rv) \quad (12)$$

where L1 and L2 are self-impedances of the inductors L1 and L2, respectively, M is a mutual impedance of the inductors L1 and L2, R1 is a series resistance of the inductor L1, R2 is a series resistance of the inductor L2, and Rv is a value of the variable resistance.

$$k = \frac{M}{\sqrt{L1 L2}} \quad (13)$$

The coupling coefficient k represents the degree of the magnetic coupling of L1 and L2 and has a value ranging from 0 to 1. It can be seen from the formula (13) that the inductance value of the inductor L1 can be varied by the resistance value Rv. Furthermore, according to the formula (2), the oscillation frequency of the LCVCO is inversely proportional to the square root of L1. Therefore, the oscillation frequency of the LCVCO can be controlled by the resistance value Rv. At that time, the oscillation frequency of LCVCO is determined by the inductance value of the formula (11) and the parasitic capacitances of the inverter and the inductor L1.

EXAMPLE 4

Figure 3:
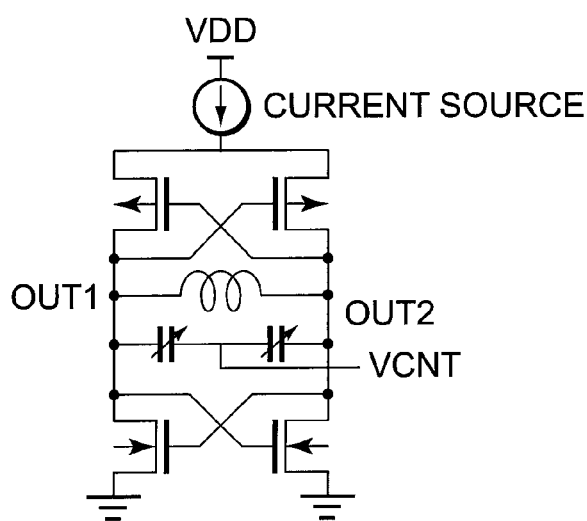
FIG. 3 is a circuit diagram of a general CMOS oscillator circuit.
Figure 4:
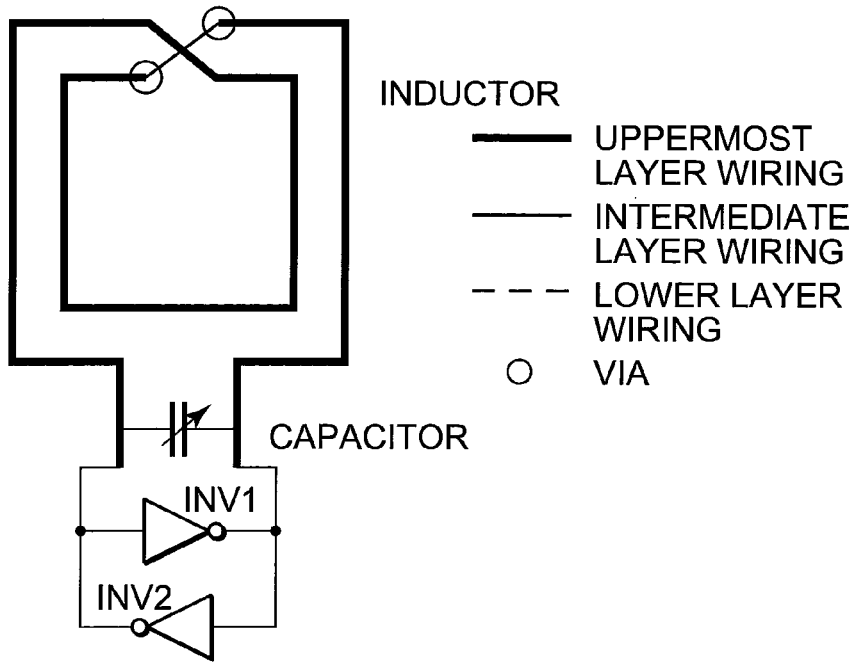
FIG. 4 is a plan view of a conventional oscillator circuit.

An oscillator circuit according to Example 4 of the present invention differs from the oscillator circuit according to Example 3 shown in FIG. 3 in that it has a capacitor having a fixed capacitance. Therefore, the explanation of the same or similar parts is omitted herein.

Figure 32:
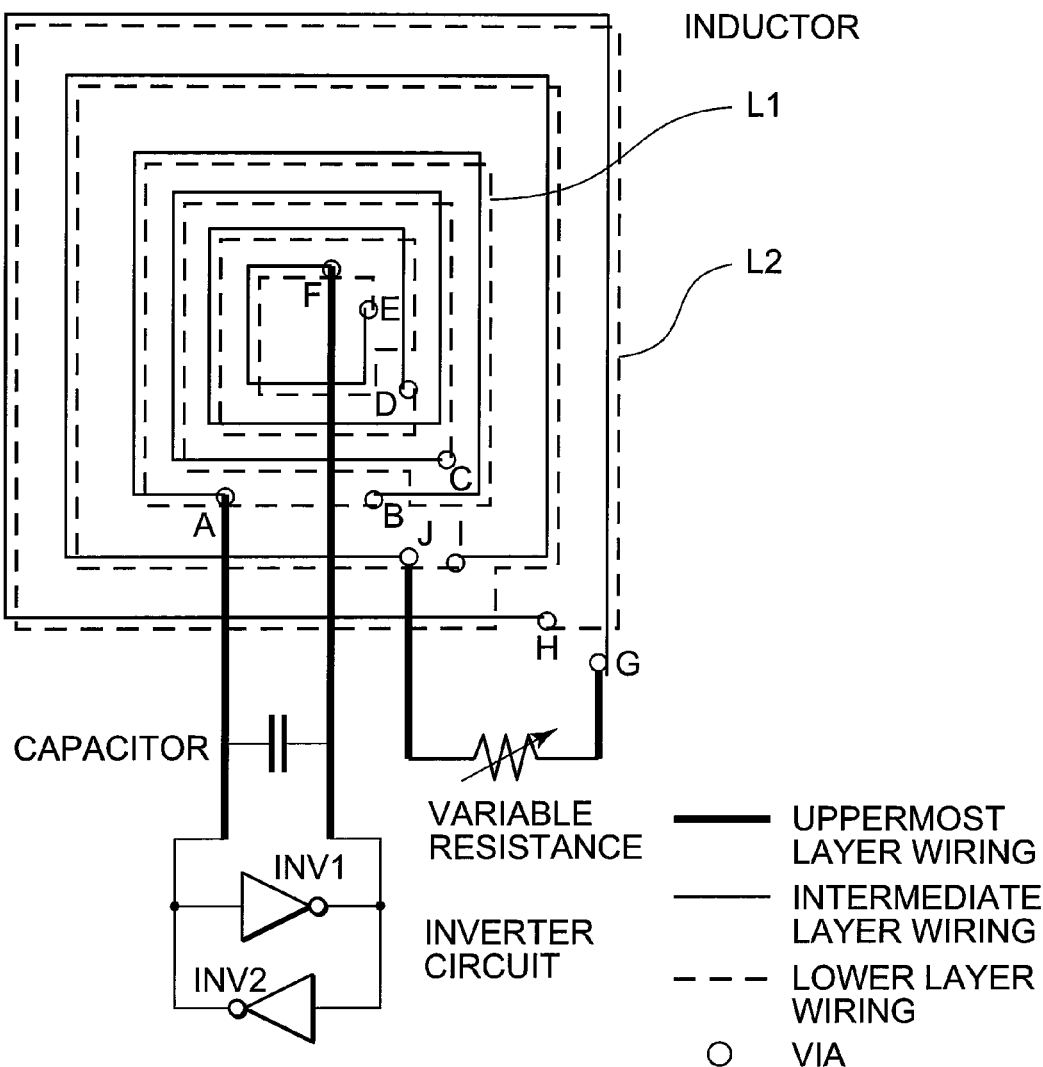
FIG. 32 is a conceptual plan view of an LCVCO as an oscillator circuit according to Example 4 of the present invention.

FIG. 32 is a conceptual plan view of an LCVCO as an oscillator circuit according to Example 4 of the present invention. In FIG. 32, the LCVCO includes an inverter circuit using two inverters INV1 and INV2, two inductors, i.e., an inductor L1 and an additional inductor L2, a capacitor having a fixed capacitance, and a variable resistance. The oscillation frequency of the oscillator circuit can be varied by the value of the variable resistance.

EXAMPLE 5

FIG. 9 is a cross-sectional view of inductor wiring in an LCVCO as an oscillator circuit according to Example 5 of the present invention. In FIG. 9, if the wire width w is made larger than the wire thickness t, then the capacitance Cv between the inductor wires vertically arranged can be made larger than the capacitance Ch between the inductor wires laterally arranged. Therefore, an effective wiring parasitic capacitance is expected to be reduced due to the 3D solenoid structure. Furthermore, Cv can be made even larger than Ch by making the interval s between the inductor wires larger than the film thickness h of an interlayer film of the inductor wiring.

EXAMPLE 6

FIG. 23 is a block diagram of a circuit for performing frequency division on an oscillation frequency of an LCVCO as an oscillator circuit according to Example 6 of the present invention. In FIG. 23, an output of the LCVCO is inputted to the frequency divider and multiplied by 1/n (n is an integer). As shown by the formula (1), the oscillation frequency of the LCVCO is inversely proportional to the square root of L1. Therefore, a large inductance value is required to oscillate at a low frequency, resulting in an increase of the chip area. However, an oscillation frequency of an LCVCO can be increased by using a frequency divider as in this example. Accordingly, the chip area can be reduced. Furthermore, phase noise can be improved by frequency division.

Embodiments 1 to 13 of the present invention will be listed as follows:

1) An on-chip oscillator circuit mounted on a semiconductor substrate, wherein a first wiring layer (the upper layer of FIG. 5) and a plurality of second wiring layers having a thickness smaller than the first wiring layer (the intermediate layer and the lower layer of FIG. 5) are stacked on the semiconductor substrate;

wherein the oscillator circuit comprises:
an inductor formed by the plurality of second wiring layers (the inductor of FIG. 5), and
an inverter circuit including an n-type MISFET and a p-type MISFET (the inverter circuit of FIG. 5);
wherein the inductor is connected to the inverter circuit so as to operate as a load on the inverter circuit;
wherein the inductor is operable to oscillate at a frequency at which the inductor and a parasitic capacitance of the inverter circuit resonate;
wherein a drain of the n-type MISFET and a drain of the p-type MISFET are connected to each other, and an output of the inductor (A and B of FIG. 5) is connected to a connection point of those drains.

2) The oscillator circuit as described in Embodiment 1, further comprising a capacitor formed by using a semiconductor device or the first wiring layer or the second wiring layers (the upper layer or the intermediate layer and the lower layer of FIG. 5),
wherein the inductor and the capacitor are connected in series or in parallel to each other,
the inductor oscillates at a frequency at which the inductor, the parasitic capacitance of the inverter circuit, and the capacitor resonate, and
an output of the capacitor is connected to the connection point at which the drains of the n-type MISFET and the p-type MISFET are connected to each other.

3) The oscillator circuit as described in Embodiment 1, further comprising an additional inductor magnetically coupled to the inductor (L2 of FIG. 31),
wherein opposite ends of a switching element or a resistance element having a variable resistance are connected between an input end and an output end of the additional inductor (the variable resistance of FIG. 31), and the oscillation frequency of the oscillator circuit is varied by varying a resistance value of the switching element or the resistance element.

4) The oscillator circuit as described in Embodiment 1, further comprising a capacitor formed by using a semiconductor device or the first wiring layer or the second wiring layers (the variable resistance of FIG. 32) and an additional inductor magnetically coupled to the inductor (L2 of FIG. 32), wherein the capacitor has a fixed capacitance, the inductor and the capacitor are connected in series or in parallel to each other, the inductor oscillates at a frequency at which the inductor, the parasitic capacitance of the inverter circuit, and the capacitor resonate, an output of the capacitor is connected to the connection point at which the drains of the n-type MISFET and the p-type MISFET (included in the inverters INV1 and INV2 of FIG. 32) are connected to each other, opposite ends of a switching element or a resistance element having a variable resistance are connected between an input end and an output end of the additional inductor, and the oscillation frequency of the oscillator circuit is varied by varying a resistance value of the switching element or the resistance element.

5) The oscillator circuit as described in Embodiment 1, wherein the plurality of second wiring layers forming the inductor includes a first layer to an nth layer stacked on each other (L10 and L20 of FIG. 8 (n=2)), each of the first layer to the nth layer (L10 and L20 of FIG. 8) extends substantially concentrically with respect to a common center from the outermost track as a first track (L11 and L21 of FIG. 8) to the innermost track as an mth track (L12 and L22 of FIG. 8 (m=2)) and has a discontinuous end in each track, wiring layers of the plurality of second wiring layers that are located vertically adjacent to each other are connected to each other through a via (the via of FIG. 8) at a location at which each of the wiring layers has the discontinuous end such that currents flow in the same direction through the wiring layers, tracks located radially adjacent to each other in a wiring layer of the uppermost layer or the lowermost layer of the plurality of second wiring layers are connected to each other at a location at which each of the tracks has the discontinuous end such that currents flow in the same direction through the tracks, the inductor is connected continuously from an end of the first track of the first layer that is not connected to another track to an end of the mth track of the first layer or the nth layer that is not connected to another track, currents flow in the same direction through tracks stacked vertically adjacent to each other, and currents flow in the same direction through tracks arranged adjacent to each other in each of the plurality of second wiring layers.

6) The oscillator circuit as described in Embodiment 1, wherein the plurality of second wiring layers forming the inductor includes a first layer to an nth layer stacked on each other (L10 and L20 of FIG. 8 (n=2)), each of the first layer to the nth layer extends substantially concentrically with respect to a common center from the outermost track as a first track (L11 and L21 of FIG. 8) to the innermost track as an mth track (L12 and L22 of FIG. 8 (m=2)) and has a discontinuous end in each track, the first layer to the nth layer (L10 and L20 of FIG. 8) have a substantially congruous shape as viewed in a plan view and are arranged without substantial deviation in a direction of rotation with respect to the common center, an end of the (k−1)th track (L11 and L21 of FIG. 8 (k=2)) of the (j−1)th layer (L10 of FIG. 8 (j=2)) is connected to an end of the (k−1)th track (L11 and L21 of FIG. 8) of the jth layer (L20 of FIG. 8) through a via (the via of FIG. 8), another end of the (k−1)th track (L11 and L21 of FIG. 8) of the jth layer (L20 of FIG. 8) is connected to an end of the (k−1)th track of the (j+1)th layer in a case where j is smaller than n, an end of the kth track (L12 of FIG. 8) of the first layer (L10 of FIG. 8) that is opposite to an end connected to the second layer (L20 of FIG. 8) is connected to an end of the (k−1)th track (L11 of FIG. 8) of the first layer (L10 of FIG. 8) in a case where k is equal to in and is connected to an end of the (k+1)th track of the first layer (L10 of FIG. 8) in a case where k is smaller than m, an end of the kth track (L22 of FIG. 8) of the nth layer (L20 of FIG. 8) that is not connected to the (n−1)th layer (L10 of FIG. 8) is connected to an end of the (k−1)th track (L21 of FIG. 8) of the nth layer (L20 of FIG. 8) in a case where k is equal to in and is connected to an end of the (k+1)th track of the nth layer (L20 of FIG. 8) in a case where k is smaller than m, the inductor is connected continuously from an end of the first track (L11 of FIG. 8) of the first layer (L10 of FIG. 8) that is not connected to another track to an end of the mth track (L10 or L20 of FIG. 8) of the first layer (L10 of FIG. 8) or the nth layer (L20 of FIG. 8) that is not connected to another track, currents flow in the same direction through tracks stacked vertically adjacent to each other, and currents flow in the same direction through tracks arranged adjacent to each other in the same layer.

7) The oscillator circuit as described in Embodiment 5, wherein the plurality of second wiring layers forming the inductor (L10 and L20 of FIG. 8) have a capacitance per length between wires stacked vertically adjacent to each other (Cv of FIG. 9) that is larger than a capacitance per length between wires arranged adjacent to each other in the same layer (Ch of FIG. 9).

8) The oscillator circuit as described in Embodiment 7, wherein the plurality of second wiring layers forming the inductor (L10 and L20 of FIG. 8) have an interval between wires arranged adjacent to each other in the same layer (s of FIG. 9) that is larger than an interval between wires stacked vertically adjacent to each other (h of FIG. 9).

9) The oscillator circuit as described in Embodiment 7, wherein the inductor has a wire width (w of FIG. 9) that is larger than a thickness of the second wiring layers (t of FIG. 9), which is a wire thickness of the inductor.

10) The oscillator circuit as described in Embodiment 2 or 3, wherein a value of at least $10^{11}$ is obtained when an inductance value of the inductor is divided by a capacitance of the capacitor and multiplied by the oscillation frequency 11) The oscillator circuit as described in Embodiment 1, wherein the inductor has a wire width (w of FIG. 9) that is equal to or less than 2 μm.

12) The oscillator circuit as described in Embodiment 1, wherein the MISFET included in the inverter circuit has a gate width that is equal to or less than 20 μm.

13) The oscillator circuit as described in Embodiment 1, wherein the oscillator circuit (FIG. 23) is configured to oscillate at a frequency (n×f of FIG. 23) that is n times as high as a required frequency (f of FIG. 23) where n is an integer and to perform 1/n frequency division on the oscillated output to thereby output the required frequency (f of FIG. 23).

INDUSTRIAL APPLICABILITY

The present invention is not limited to the aforementioned examples. It should be understood that various modifications may be made within the technical scope defined by the appended claims.

This application is the National Phase of PCT/JP2008/066622, filed on Sep. 9, 2008, which claims the benefit of priority from Japanese patent application No. 2007-256837, filed on Sep. 28, 2007, the disclosure of which is incorporated herein in its entirety by reference.

The invention claimed is:

1. An on-chip oscillator circuit mounted on a semiconductor substrate, wherein a first wiring layer and a plurality of second wiring layers having a thickness smaller than the first wiring layer are stacked on the semiconductor substrate;
   wherein the oscillator circuit comprises:
      an inductor formed by the plurality of second wiring layers, and
      an inverter circuit including an n-type MISFET and a p-type MISFET;
   wherein the inductor is connected to the inverter circuit so as to operate as a load on the inverter circuit;
   wherein the inductor is operable to oscillate at a frequency at which the inductor and a parasitic capacitance of the inverter circuit resonate;
   wherein a drain of the n-type MISFET and a drain of the p-type MISFET are connected to each other, and an output of the inductor is connected to a connection point of those drains;
   wherein the plurality of second wiring layers forming the inductor includes a first layer to an nth layer stacked on each other where n is an integer not less than 2,
      each of the first layer to the nth layer extends substantially concentrically with respect to a common center from an outermost turn as a first turn to an innermost turn as an mth turn where m is an integer not less than 2 and has a discontinuous end in each turn,
      wiring layers of the plurality of second wiring layers that are located vertically adjacent to each other are connected to each other through a via at a location at which each of the wiring layers has the discontinuous end such that currents flow in the same direction through the wiring layers,
      turns located radially adjacent to each other in a wiring layer of the uppermost layer or the lowermost layer of the plurality of second wiring layers are connected to each other at a location at which each of the turns has the discontinuous end such that currents flow in the same direction through the turns,
      the inductor is connected continuously from an end of the first turn of the first layer that is not connected to another turn to an end of the mth turn of the first layer or the nth layer that is not connected to another turn, and
      currents flow in the same direction through turns stacked vertically adjacent to each other, and currents flow in the same direction through turns arranged adjacent to each other in each of the plurality of second wiring layers.

2. The oscillator circuit according to claim 1, further comprising a capacitor formed by using a semiconductor device or the first wiring layer or the second wiring layers,
   wherein the inductor and the capacitor are connected in series or in parallel to each other,
   the inductor oscillates at a frequency at which the inductor, the parasitic capacitance of the inverter circuit, and the capacitor resonate, and
   an output of the capacitor is connected to the connection point at which the drains of the n-type MISFET and the p-type MISFET are connected to each other.

3. The oscillator circuit according to claim 1, further comprising an additional inductor magnetically coupled to the inductor,
   wherein opposite ends of a switching element or a resistance element having a variable resistance are connected between an input end and an output end of the additional inductor, and the oscillation frequency of the oscillator circuit is varied by varying a resistance value of the switching element or the resistance element.

4. The oscillator circuit according to claim 3, wherein a value of at least $10^{11}$ is obtained when an inductance value of the inductor is divided by a capacitance of the capacitor and multiplied by the oscillation frequency.

5. The oscillator circuit according to claim 1, further comprising a capacitor formed by using a semiconductor device or the first wiring layer or the second wiring layers and an additional inductor magnetically coupled to the inductor,
   wherein the capacitor has a fixed capacitance,
   the inductor and the capacitor are connected in series or in parallel to each other,
   the inductor oscillates at a frequency at which the inductor, the parasitic capacitance of the inverter circuit, and the capacitor resonate,
   an output of the capacitor is connected to the connection point at which the drains of the n-type MISFET and the p-type MISFET are connected to each other, and
   opposite ends of a switching element or a resistance element having a variable resistance are connected between an input end and an output end of the additional inductor, and the oscillation frequency of the oscillator circuit is varied by varying a resistance value of the switching element or the resistance element.

6. The oscillator circuit according to claim 1, wherein the plurality of second wiring layers forming the inductor includes a first layer to an nth layer stacked on each other where n is an integer not less than 2,
   each of the first layer to the nth layer extends substantially concentrically with respect to a common center from an outermost turn as a first turn to an innermost turn as an mth turn where m is an integer not less than 2 and has a discontinuous end in each turn,
   the first layer to the nth layer have a substantially congruous shape as viewed in a plan view and are arranged without substantial deviation in a direction of rotation with respect to the common center,
   an end of a (k−1)th turn of a (j−1)th layer is connected to an end of a (k−1)th turn of a jth layer through a via where j is an integer ranging from 2 to n and k is an integer ranging from 2 to m,
   another end of the (k−1)th turn of the jth layer is connected to an end of the (k−1)th turn of a (j+1)th layer in a case where j is smaller than n,
   an end of a kth turn of the first layer that is opposite to an end connected to the second layer is connected to an end of the (k−1)th turn of the first layer in a case where k is equal to m and is connected to an end of a (k+1)th turn of the first layer in a case where k is smaller than m,
   an end of the kth turn of the nth layer that is not connected to the (n−1)th layer is connected to an end of the (k−1)th turn of the nth layer in a case where k is equal to m and is connected to an end of the (k+1)th turn of the nth layer in a case where k is smaller than m,
   the inductor is connected continuously from an end of the first turn of the first layer that is not connected to another turn to an end of the mth turn of the first layer or the nth layer that is not connected to another turn, currents flow in the same direction through turns stacked vertically adjacent to each other, and currents flow in the same direction through turns arranged adjacent to each other in the same layer.

7. The oscillator circuit according to claim 1, wherein the plurality of second wiring layers forming the inductor have a capacitance per length between wires stacked vertically adjacent to each other that is larger than a capacitance per length between wires arranged adjacent to each other in the same layer.

8. The oscillator circuit according to claim 7, wherein the plurality of second wiring layers forming the inductor have an interval between wires arranged adjacent to each other in the same layer that is larger than an interval between wires stacked vertically adjacent to each other.

9. The oscillator circuit according to claim 7, wherein the inductor has a wire width that is larger than a thickness of the second wiring layers, which is a wire thickness of the inductor.

10. The oscillator circuit according to claim 2, wherein a value of at least $10^{11}$ is obtained when an inductance value of the inductor is divided by a capacitance of the capacitor and multiplied by the oscillation frequency.

11. The oscillator circuit according to claim 1, wherein the inductor has a wire width that is equal to or less than 2 μm.

12. The oscillator circuit according to claim 1, wherein the MISFET included in the inverter circuit has a gate width that is equal to or less than 20 μm.

13. The oscillator circuit according to claim 1, wherein the oscillator circuit is configured to oscillate at a frequency that is n times as high as a required frequency where n is an integer and to perform 1/n frequency division on the oscillated output to thereby output the required frequency.

* * * * *